United States Patent
Younis

(10) Patent No.: US 10,358,341 B2
(45) Date of Patent: Jul. 23, 2019

(54) MULTI-FREQUENCY EXCITATION

(71) Applicant: KING ABDULLAH UNIVERSITY OF SCIENCE AND TECHNOLOGY, Thuwal (SA)

(72) Inventor: Mohammad Younis, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 212 days.

(21) Appl. No.: 15/508,130

(22) PCT Filed: Sep. 4, 2015

(86) PCT No.: PCT/IB2015/001688
§ 371 (c)(1),
(2) Date: Mar. 2, 2017

(87) PCT Pub. No.: WO2016/034940
PCT Pub. Date: Mar. 10, 2016

(65) Prior Publication Data
US 2017/0291811 A1    Oct. 12, 2017

Related U.S. Application Data

(60) Provisional application No. 62/046,534, filed on Sep. 5, 2014, provisional application No. 62/047,289, filed on Sep. 8, 2014.

(51) Int. Cl.
*B81B 7/00* (2006.01)
*H03H 9/02* (2006.01)
(Continued)

(52) U.S. Cl.
CPC ............ *B81B 7/008* (2013.01); *G01P 15/125* (2013.01); *G02B 26/0833* (2013.01);
(Continued)

(58) Field of Classification Search
CPC ............ H03H 3/0076; H03H 9/02259; H03H 9/02393; H03H 9/462; H03H 9/467;
(Continued)

(56) References Cited

U.S. PATENT DOCUMENTS 6,707,351 B2 *  3/2004  Gorrell ................ H03H 3/0077
                                                                257/414
2007/0149159 A1   6/2007  Kayano

OTHER PUBLICATIONS

Alfadhel, A., et al., "Three-Axis Magnetic Field Induction Sensor Realized on Buckled Cantilever Plate," IEEE Transactions on Magnetics, Jul. 2013, vol. 49, pp. 4144-4147.
(Continued)

*Primary Examiner* — Barbara Summons
(74) *Attorney, Agent, or Firm* — Patent Potfolio Buiders PLLC

(57) ABSTRACT

Embodiments of multi-frequency excitation are described. In various embodiments, a natural frequency of a device may be determined. In turn, a first voltage amplitude and first fixed frequency of a first source of excitation can be selected for the device based on the natural frequency. Additionally, a second voltage amplitude of a second source of excitation can be selected for the device, and the first and second sources of excitation can be applied to the device. After applying the first and second sources of excitation, a frequency of the second source of excitation can be swept. Using the methods of multi-frequency excitation described herein, new operating frequencies, operating frequency ranges, resonance frequencies, resonance frequency ranges, and/or resonance responses can be achieved for devices and systems.

20 Claims, 34 Drawing Sheets

(51) Int. Cl.
H03H 9/46 (2006.01)
H03H 9/52 (2006.01)
G01P 15/08 (2006.01)
G02B 26/08 (2006.01)
H03H 3/007 (2006.01)
G01P 15/125 (2006.01)

(52) U.S. Cl.
CPC ...... H03H 3/0076 (2013.01); H03H 9/02259 (2013.01); H03H 9/525 (2013.01); B81B 2201/0235 (2013.01); B81B 2201/0271 (2013.01); B81B 2201/042 (2013.01); G01P 2015/0862 (2013.01); H03H 9/02393 (2013.01); H03H 9/467 (2013.01)

(58) Field of Classification Search
CPC .......... H03H 9/52; H03H 9/525; B81B 7/008; B81B 2201/0235; B81B 2201/042; B81B 2201/0271; G01P 15/125; G01P 2015/0862; G02B 26/0833
USPC .................................................. 333/186, 188
See application file for complete search history.

(56) References Cited

OTHER PUBLICATIONS

Bagheri, M., et al., "Dynamic Manipulation of Nanomechanical Resonators in the High-Amplitude Regime and Non-Volatile Mechanical Memory Operation," Nature Nanotechnology, Oct. 23, 2011, vol. 6, pp. 726-732.
Bataineh, A. M., et al., "Dynamics of a Clamped-Clamped Microbeam Resonator Considering Fabrication Imperfections," Microsystem Technologies, Oct. 18, 2014, pp. 2425-2434.
Burg, T. P., et al., "Vacuum-Packaged Suspended Microchannel Resonant Mass Sensor for Biomolecular Detection," Journal of Microelectromechanical Systems, Dec. 2006, vol. 15, pp. 1466-1476.
Challa, V. R., et al., "A Vibration Energy Harvesting Device with Bidirectional Resonance Frequency Tunability," Smart Materials and Structures, Jan. 8, 2008, vol. 17, pp. 015035-015045.
Cho, H., et al., "Tunable, Broadband Nonlinear Nanomechanical Resonator," Nano Letters, Apr. 12, 2010, vol. 10, pp. 1793-1798.
Dohn, S., et al., "Enhanced Functionality of Cantilever Based Mass Sensors Using Higher Modes," Applied Physics Letters, Jun. 5-9, 2005, vol. 86, Issue 23, pp. 233501-1-233501-3.
Forchheimer, D., et al., "Model-Based Extraction of Material Properties in Multifrequency Atomic Force Microscopy," Physical Review B, May 24, 2012, vol. 85, pp. 195449-1-195449-7.
Gallacher, B., et al., "A Control Scheme for a MEMS Electrostatic Resonant Gyroscope Excited Using Combined Parametric Excitation and Harmonic Forcing," Journal of Micromechanics and Microengineering, 2006, vol. 16, pp. 320-331.
Gil-Santos, E., et al., "Nanomechanical Mass Sensing and Stiffness Spectrometry Based on Two-Dimensional Vibrations of Resonant Nanowires," Nature Nanotechnology, Aug. 8, 2010, vol. 5, pp. 641-645.
Hanay, M., et al., "Single-Protein Nanomechanical Mass Spectrometry in Real Time," Nature Nanotechnology, Aug. 26, 2012, vol. 7, pp. 602-608.
Harne, R., et al., "A Review of the Recent Research on Vibration Energy Harvesting Via Bistable Systems," Smart Materials and Structures, Jan. 25, 2013, vol. 22, pp. 023001-023013.
Hsu, W-T., et al., "A Resonant Temperature Sensor Based on Electrical Spring Softening," Digest of Technical Papers, 11th International Conference on Solid-State Sensors Actuators (Transducers' 01), Munich, Germany, Jun. 10-14, 2001, pp. 1484-1487.
Ilyas, S., et al., "An Experimental and Theoretical Investigation of a Micromirror Under Mixed-Frequency Excitation," Journal of Microelectromechanical Systems, Aug. 2015, vol. 24, No. 4, pp. 1124-1131.
Jin, D., et al., "High-Mode Resonant Piezoresistive Cantilever Sensors for Tens-Femtogram Resoluble Mass Sensing in Air," Journal of Micromechanics and Microengineering, Apr. 7, 2006, vol. 16, pp. 1017-1023.
Kalyanaraman, R., et al., "Equivalent Area Nonlinear Static and Dynamic Analysis of Electrostatically Actuated Microstructures," Microsystem Technologies, Jan. 2013, vol. 19, pp. 61-70.
Kim, H. C., et al., "Inertial-Grade Out-of-Plane and In-Plane Differential Resonant Silicon Accelerometers (DRXLs)," The 13th International Conference on Solid-State Sensors, Actuators and Microsystems (Transducers '05), Seoul, Korea, Jun. 5-9, 2005, pp. 172-175.
Liu, H., et al., "A Multi-Frequency Vibration-Based MEMS Electromagnetic Energy Harvesting Device," Sensors and Actuators A: Physical, Dec. 15, 2013, vol. 204, pp. 37-43.
Mahboob, I., et al., "Interconnect-Free Parallel Logic Circuits in a Single Mechanical Resonator," Nature Communications, Feb. 15, 2011, vol. 2, pp. 1-7.
Marnat, L., et al., "New Movable Plate for Efficient Millimeter Wave Vertical on-Chip Antenna," IEEE Transactions on Antennas and Propagation, Apr. 2013, vol. 61, pp. 1608-1615.
Nayfeh, A. H., et al., "Dynamics of MEMS Resonators Under Superharmonic and Subharmonic Excitations," Journal of Micromechanics and Microengineering, Aug. 9, 2015, vol. 15, pp. 1840-1847.
Piekarski, B., et al., "Fabrication of Suspended Piezoelectric Microresonators," Integrated Ferroelectrics, 1999, vol. 24, pp. 147-154.
Ramini, A. H. et al., "A Low-g Electrostatically Actuated Resonant Switch," Smart Materials and Structures, Jan. 2013, vol. 22, pp. 964-1726.
Rhoads, J. F., et al., "Nonlinear Dynamics and its Applications in Micro-and Nanoresonators," Journal of Dynamic Systems, Measurement, and Control, May 2010, vol. 132, pp. 034001-1-034001-14.
Rhoads, J. F., et al., "The Non-Linear Dynamics of Electromagnetically Actuated Microbeam Resonators with Purely Parametric Excitations," International Journal of Non-Linear Mechanics, Apr. 10, 2013, vol. 55, pp. 79-89.
Rinaldi, G., et al., "Quantitative Boundary Support Characterization for Cantilever MEMS," Sensors, Oct. 3, 2007, vol. 7, pp. 2062-2079.
Subhashini, S., et al., "Toxic Gas Sensor Using Resonant Frequency Variation in Micro-Cantilever," 2012 IEEE Conference on Sustainable Utilization and Development in Engineering and Technology (STUDENT), Oct. 6-9, 2012, pp. 87-91.
Younis, M., "Multi-Mode Excitation of a Clamped-Clamped Microbeam Resonator," Nonlinear Dynamics, May 1, 2015, vol. 80, pp. 1531-1541.
Younis, M., et al., "A Study of the Nonlinear Response of a Resonant Microbeam to an Electric Actuation," Nonlinear Dynamics, 2003, vol. 31, pp. 91-117.
International Search Report and Written Opinion of Application No. PCT/IB2015/001688 dated Feb. 2, 2016, 10 pages.
Fadi M Alsaleem et al: "On the nonlinear resonances and dynamic pull-in of electrostatically actuated resonators", Journal of Micromechanics & Microengineering, Institute of Physics Publishing. Bristol, GB, vol. 19, No. 4, Mar. 17, 2009 (Mar. 17, 2009), 14 pages, XP020153380.

* cited by examiner

| Color | Material | Thickness | Width | Modulus of Elasticity | Density |
|---|---|---|---|---|---|
| | Silicon Wafer | 5 mm | | | |
| | SiO$_2$ | 500 μm | | | |
| | Cr | 50 nm | 40 μm | 279 GPa | 7190 Kg/m$^3$ |
| | Au (1) | 500 nm | | 79 GPa | 19300 Kg/m$^3$ |
| | Au (2) | 250 nm | 40 μm | 79 GPa | 19300 Kg/m$^3$ |
| | Pi | 6 μm | 50 μm | 8.5 GPa | 1400 Kg/m$^3$ |
| | Ni | 500 nm | 50 μm | 200 GPa | 8908 Kg/m$^3$ |

MULTI-FREQUENCY EXCITATION

CROSS-REFERENCE TO RELATED APPLICATIONS

This application is the National Stage of International Application No. PCT/IB2015/001688, filed 4 Sep. 2015, which claims the benefit of and priority to U.S. Provisional Patent Application No. 62/046,534 entitled "MULTI-FREQUENCY EXCITATION", filed on 5 Sep. 2014 and U.S. Provisional Patent Application No. 62/047,289, entitled "MULTI-FREQUENCY EXCITATION", filed on 8 Sep. 2014, all of which are expressly incorporated by reference as if fully set forth herein in their entirety.

BACKGROUND

Today, micro- and nano-scale devices or systems (e.g., microelectromechanical (MEMS) and nanoelectromechanical (NEMS)) may offer an attractive option in certain applications. The natural operating frequencies of these (and similar) devices, however, have barely reached the kHz or MHz ranges, while higher operating frequencies have been sought. At the same time, manufacturing MEMS and NEMS has presented several challenges with regard to fabrication and uniformity. Thus, at least to some extent, the use of devices or systems including MEMS and NEMS, for example, has been limited due to the difficulties encountered in the design and manufacture of such devices or systems having suitable operating frequencies.

SUMMARY

Among other favorable aspects, MEMS and NEMS systems offer lower cost, higher sensitivity, better thermal properties, smaller size, and lower power consumption. Currently, carbon nanotube (CNT) resonators are the smallest manufactured mechanical resonators. The operating frequencies of these resonators have barely reached kHz or MHz ranges, while higher operating frequencies have been sought. Meanwhile, the manufacture of such CNT resonators has presented challenging problems with regard to fabrication and uniformity.

Meanwhile, it is a well-known technological problem that sharp resonance responses typically come at the expense of operating bandwidth. In other words, even a small mismatch between the excitation input and the natural frequency response of a sensor or actuator (e.g., due to noise, thermal variations, or other imperfections) may lead to a significant drop in the amplitude of the output response of the sensor or actuator. To resolve this, one solution in the state of the art relies on mechanically coupling more than one resonant device together. This approach, however, increases complexity, cost, and size.

In this context, using the techniques of multi-frequency excitation described herein, new or distinctive operating frequencies, operating frequency ranges, resonance frequencies, resonance frequency ranges, and/or resonance responses of devices and systems, including micro- and nano-scale devices, for example, can be realized. In one embodiment, the multi-frequency excitation of nonlinear MEMS and NEMS devices provides the ability to realize resonators suitable for operation at higher, lower, and/or wider frequency ranges, including frequency ranges which could not be realized otherwise. The ability to operate MEMS and NEMS devices over higher, lower, and/or wider frequency ranges is desirable for several applications including aerospace, radar, communications, and defense applications, among others.

The embodiments described herein can be relied upon to mitigate at least some of the operating frequency limitations described above by exciting relatively larger micro-scale devices into higher frequency regimes which were generally reserved to nano-scale devices such as CNTs, for example. That is, by an application of the multi-frequency excitation techniques described herein, the operating frequencies and/or frequency ranges of nano-scale devices can be realized using micro-scale devices. Further, the use of the multi-frequency excitation techniques described herein can be relied upon to tailor and/or enhance the operating frequencies or frequency ranges of micro- and nano-scale actuators, while avoiding complicated manufacturing or fabrication problems.

As one example application of the embodiments described herein, relatively smaller micro- and nano-scale devices can be operated into lower frequency regimes which were generally reserved to other devices. This operation can be desirable for several applications, such as in using sensors at lower frequencies and harvesting energy using small micro-scale (i.e., high frequency) structures at relatively low frequency ranges (e.g., capturing bridge and building vibrations, etc.). Previously, the mismatch between the relatively high natural frequencies of micro-scale structures and the relatively low frequencies of environmental sources has been a bottleneck in the energy harvesting field.

As further described below, the embodiments described herein include techniques for the excitation of structures and devices, such as (but not limited to) micro- or nano-scale structures and devices, by way of multi-frequency excitation using two or more excitation sources. The excitation can be in the presence of nonlinearities. The nonlinearities can be quadratic, cubic, or of other orders. These nonlinearities can exist naturally or be induced artificially in the micro- or nano-scale structures. For example, a quadratic nonlinearity may can be induced by way of electrostatic excitation, and a cubic nonlinearity may can be induced by deformation of thin structures.

In various embodiments, a method of multi-frequency excitation of a MEMS or NEMS device is described. The method can include applying a first source of excitation to the device and applying a second source of excitation to the device, where the first source of excitation has a fixed frequency and a frequency of the second source of excitation is swept. According to certain aspects of the embodiments, the frequency of the second source of excitation can be swept to induce at least one combination resonance in the device based on a combination of the frequency of the second source of excitation and the fixed frequency of the first source of excitation.

In another embodiment, the method includes determining a natural frequency of a MEMS or NEMS device, selecting a first voltage amplitude of a first source of excitation for the device, and selecting a first fixed frequency of the first source of excitation for the device based on the natural frequency. The method can include selecting a second voltage amplitude of a second source of excitation for the device and applying the first and second sources of excitation to the device. After applying the first and second sources of excitation, the method can further include sweeping a frequency of the second source of excitation to induce at least one combination resonance in the device based on a combination of the frequency of the second source of excitation and the fixed frequency of the first source of excitation.

In another embodiment, a system for multi-frequency excitation of a device is described. The system includes a first source of excitation applied to the device and a second source of excitation applied to the device, where the first source of excitation has a fixed frequency and the second source of excitation is swept in frequency. A frequency of the second source of excitation can be applied to the device and swept to induce at least one combination resonance in the device based on a combination of the frequency of the second source of excitation and the fixed frequency of the first source of excitation.

In an embodiment, a method of multi-frequency excitation of a device can be provided, comprising: determining a natural frequency of the device; selecting a first voltage amplitude of a first source of excitation for the device; selecting a fixed frequency of the first source of excitation based on the natural frequency; selecting a second voltage amplitude of a second source of excitation for the device; applying the first source of excitation to the device; applying the second source of excitation to the device; and sweeping a frequency of the second source of excitation.

In any one or more aspects of the embodiments, systems and/or methods, the first source of excitation can have a relatively small fixed frequency. The second source of excitation can be swept around a natural frequency of the device to induce at least one combination resonance in the device. The at least one combination resonance can comprise combination resonances of additive and subtractive types in the device. The relatively small fixed frequency can provide spacing between peaks of the natural frequency of the device and the combination resonances of additive and subtractive types in the device. A voltage amplitude of the first source of excitation for the device can be selected. A voltage amplitude of the first source of excitation can be adjusted to adjust an amplitude of the least one combination resonance in the device. A voltage amplitude of the second source of excitation for the device can be selected. A voltage amplitude of the second source of excitation can be adjusted to adjust an amplitude of a natural frequency resonance of the device. An operating bandwidth of the device can be increased by setting the fixed frequency of the first source of excitation to a relatively low frequency. An operating bandwidth of the device can be increased by applying one or more of the other sources of excitation to the device.

Using the methods of multi-frequency excitation described herein, new operating frequencies, operating frequency ranges, resonance frequencies, resonance frequency ranges, and/or resonance responses can be achieved for devices and systems.

Other systems, methods, features, and advantages of the present disclosure, will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE DRAWINGS

For a more complete understanding of the embodiments described herein and the advantages thereof, reference is now made to the following description, in conjunction with the accompanying figures briefly described below.

Figure 1:
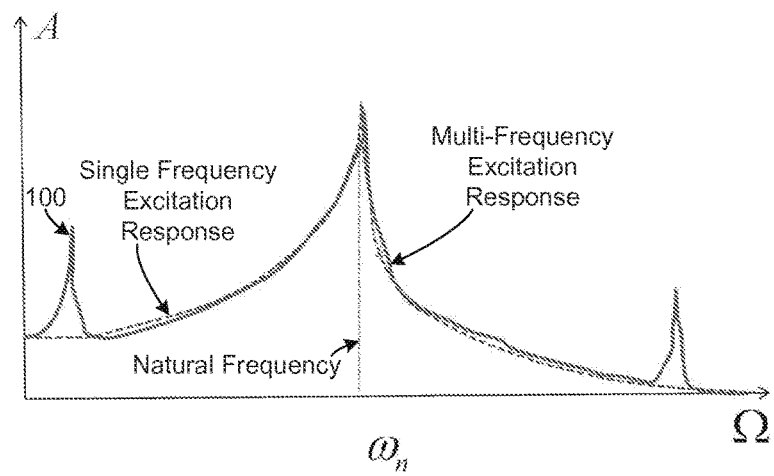
FIG. 1 illustrates example frequency response curves for a structure excited by both a single frequency excitation source and a multi-frequency excitation source according to the embodiments described herein.

The drawings illustrate only example embodiments and are therefore not to be considered limiting of the scope described herein, as other equally effective embodiments are within the scope and spirit of this disclosure. The elements and features shown in the drawings are not necessarily drawn to scale, emphasis instead being placed upon clearly illustrating the principles of the embodiments. Additionally, certain dimensions may be exaggerated to help visually convey certain principles. Moreover, in the drawings, similar reference numerals between figures designate like or corresponding, but not necessarily the same, elements.

DETAILED DESCRIPTION

Described below are various embodiments of the present systems and methods for multi-frequency excitation. Although particular embodiments are described, those embodiments are mere exemplary implementations of the system and method. One skilled in the art will recognize other embodiments are possible. All such embodiments are intended to fall within the scope of this disclosure. Moreover, all references cited herein are intended to be and are hereby incorporated by reference into this disclosure as if fully set forth herein. While the disclosure will now be described in reference to the above drawings, there is no intent to limit it to the embodiment or embodiments disclosed herein. On the contrary, the intent is to cover all alternatives, modifications and equivalents included within the spirit and scope of the disclosure.

Turning to the drawings, aspects of the embodiments are now described in further detail. In a system having a nonlinearity and natural frequency $\omega_n$ under the excitation of a single excitation source of frequency $\Omega_1$, when excited by another excitation frequency $\Omega_2$, respective resonance peaks are observed when $\Omega_2+\Omega_2=\omega_n$ (additive case) and $\Omega_1-\Omega_2=\omega_n$ (subtractive case). These respective resonance peaks are referred to as combination resonances of additive and subtractive type.

FIG. 1 illustrates example frequency response curves for a structure excited by both a single frequency excitation source and a multi-frequency excitation source. As illustrated in FIG. 1, as compared to the natural frequency of a structure, it is possible to obtain a low frequency resonance in a structure or device using the multi-frequency excitation techniques described herein. Here, consider a structure having a natural frequency $\omega_n$ of 1000 Hz. Using two excitation sources, with one excitation frequency $\Omega_1$ fixed at 950 Hz and another excitation frequency $\Omega_2$ being swept (i.e., not fixed), a low frequency resonance 100 can be obtained near $\Omega_2=50$ Hz, as illustrated in FIG. 1. In this case, it should be noted that $\Omega_1+\Omega_2=\omega_n$ (i.e., the additive case).

Figure 2:
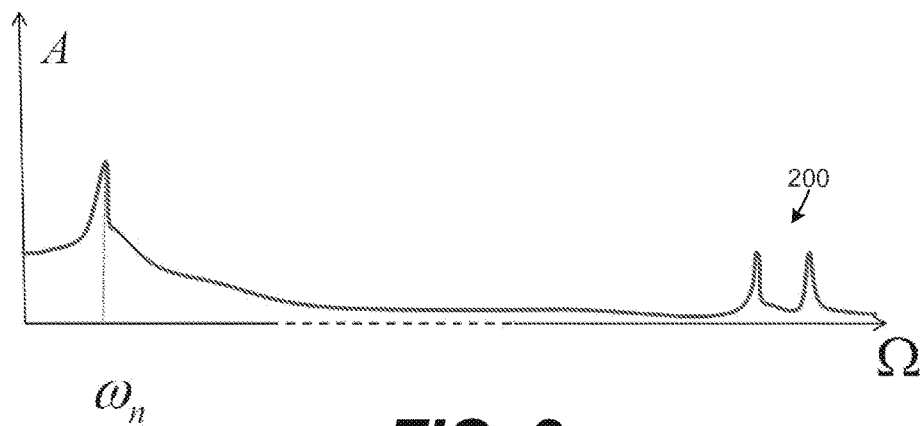
FIG. 2 illustrates an example frequency response curve including a high resonance frequency obtained according to the multi-frequency excitation embodiments described herein.

It is also possible to obtain a high frequency resonance compared to the natural frequency of a structure. FIG. 2 illustrates an example frequency response curve including high frequency resonances 200 obtained according to the multi-frequency excitation embodiments described herein. Here, consider a structure having a natural frequency of $\omega_n=100$ MHz. Using two excitation sources, with one excitation frequency $\Omega_1$ fixed at 2 GHz and another excitation frequency $\Omega_2$ being swept, high frequency resonances 200 can be obtained at $\Omega_2=2.1$ GHz (the subtractive case of $\Omega_2-\Omega_1=\omega_n$) and $\Omega_2=1.9$ GHz (the case of $\Omega_2+\Omega_1=\omega_n$), as illustrated in FIG. 2.

Figure 3:
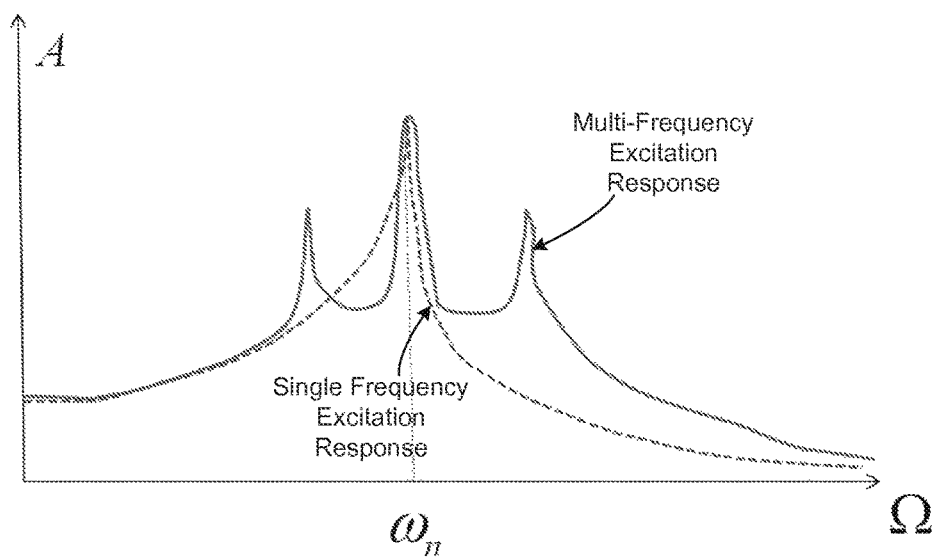
FIG. 3 illustrates an example frequency response curve including a widened resonance band according to the multi-frequency excitation embodiments described herein.

It is also possible to widen the band of resonance near a main resonance frequency of a structure. FIG. 3 illustrates an example frequency response curve including a widened resonance band according to the multi-frequency excitation embodiments described herein. In this context, it is noted that a relatively broad operating bandwidth is desirable for most sensors and actuators. Here, consider a structure having a natural frequency $\omega_n$ of 1 kHz. Using one fixed excitation source $\Omega_1$ at 50 Hz and another swept excitation source $\Omega_2$, resonances may be obtained at $\Omega_2=950$ Hz (the additive case of $\Omega_2+\Omega_2=\omega_n$) and at $\Omega_2=1050$ Hz (the subtractive case of $\Omega_2-\Omega_1=\omega_n$), as illustrated in FIG. 3.

As an empirical study of the multi-frequency excitation embodiments described herein, the dynamic behavior of a micro mirror is examined under two source excitations. Lumped parameter techniques are used to model the system as a single degree of freedom. Based on the results, several frequency response curves for various excitation loads are described below. The system exhibits primary resonance, super harmonic, and combination resonances of additive and subtractive type. These new combination resonances exhibit properties having potential applications in resonators, mixers, and energy harvesters, for example. The results are presented in the form of frequency response curves for different source excitation voltages and frequencies.

Figure 4A:
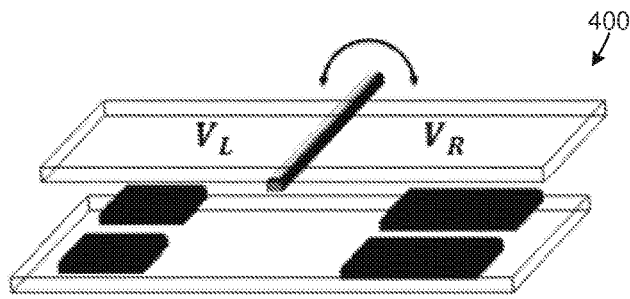
FIG. 4A provides a representative illustration of a micro mirror evaluated using multi-frequency excitation techniques according to various embodiments described herein.
Figure 4B:
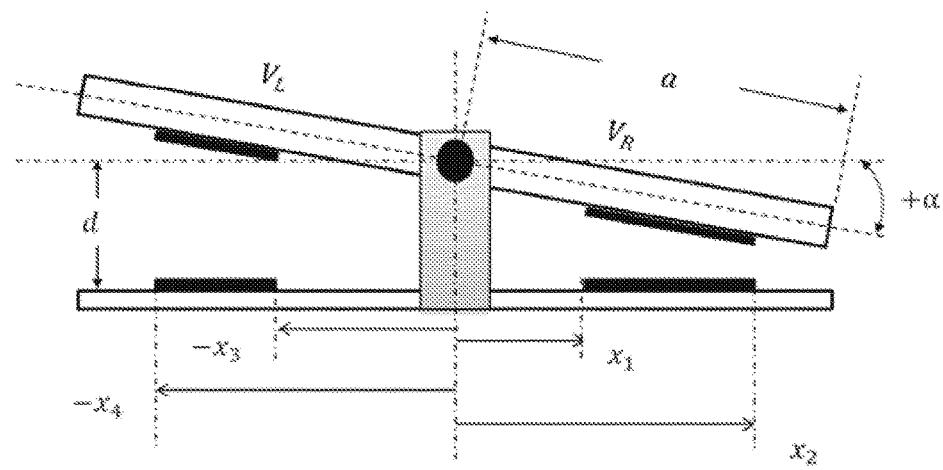
FIG. 4B provides a representative side view illustration of the micro mirror in FIG. 4A.
Figure 4C:
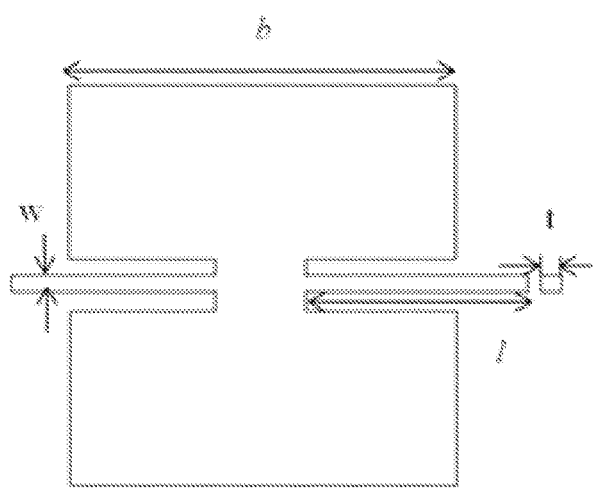
FIG. 4C provides a representative plan view illustration of the micro mirror in FIG. 4A.

FIG. 4A provides a representative illustration of a micro mirror 400 evaluated using multi-frequency excitation techniques according to various embodiments described herein. FIG. 4B provides a representative side view illustration of the micro mirror 400 in FIG. 4A, and FIG. 4C provides a representative plan view illustration of the micro mirror 400 in FIG. 4A.

The micro mirror 400 can be actuated in one of three ways. First, a voltage difference may be applied to only the larger right half electrodes of the micro mirror 400. Second, a voltage difference may be applied to only the smaller left half electrodes of the micro mirror 400. Third, the micro mirror 400 can be actuated by applying a voltage difference between the gate and one electrode on each of the right and left sides. In this case, a double well potential is applied, and the equilibrium point of the micro mirror 400 can be shifted to either side by adjusting the voltage difference. Depending on the type of actuation, various equilibrium positions and resonant modes of the micro mirror 400 can be achieved.

Figure 4D:
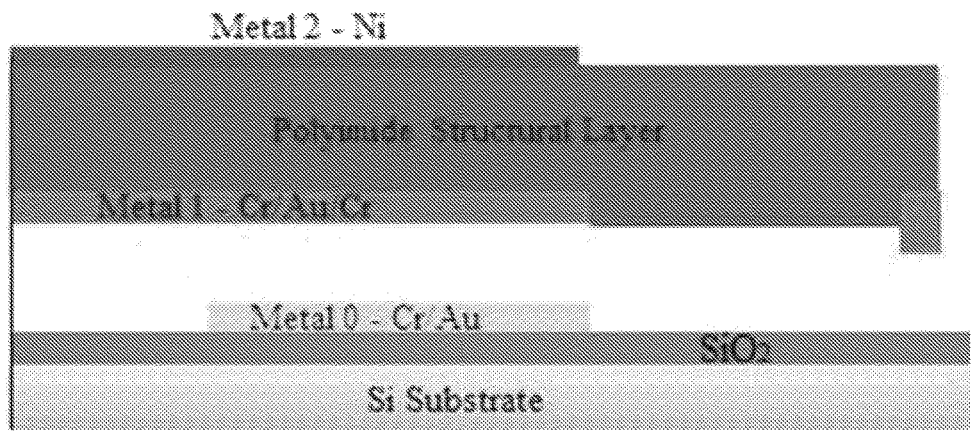
FIG. 4D provides a fabrication process cross-section of one side of the mirror in FIG. 4A.

FIG. 4D provides a fabrication process cross-section of one side of the mirror 400 in FIG. 4A. The micro mirror 400 is fabricated using a 6 layer fabrication process based on surface micromachining techniques. FIG. 4D provides the fabrication cross section of the right half of the mirror. It is approximately 7 µm thick in total comprising of a polyimide structural layer with a nominal thickness of 6 µm. It is also separated by 5 µm gap from its bottom electrodes which are patterned on an Si substrate. A Metal_0 layer of 50 nm/250 nm of Cr/Au forms these fixed ground electrodes. A 50 nm/250 nm/50 nm layer of Cr/Au/Cr forms the Metal_1 layer patterned onto the structural layer forming the movable gate electrodes. Anchors are used to hold the actuator to the ground as well as to provide electrical signal to the movable gate electrodes whereas dimples are incorporated to avoid the electrical shorting of the electrodes upon pull in. The Metal_2 layer comprises of 450 nm of Ni patterned similar to the Metal_1 layer to avoid the bimorph effect and to have a straight structure.

Figure 4E:
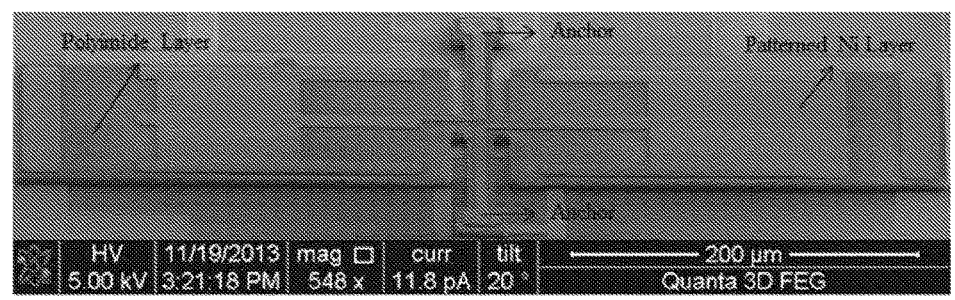
FIG. 4E provides a scanning electron microscope image of a micro mirror consistent with the structure of the micro mirror in FIG. 4A.

FIG. 4E provides a scanning electron microscope image of a micro mirror consistent with the structure of the micro mirror in FIG. 4A. In FIG. 4E, two anchors holding the mirror and allowing its torsional motion are shown. The patterned metal visible on top of the polyimide structural layer is Ni used to counter the bimorph effect.

In the context of the study of the micro motor 400 described below, Table 1 provides a listing of variables and associated definitions.

TABLE 1

| Variable | Definition |
| --- | --- |
| G | Shear modulus |
| $J_P$ | Polar moment of inertia |
| I | Mass moment of inertia |
| $K_t$ | Torsional stiffness |
| $M_L$ | Moment on the left side of mirror |
| $M_R$ | Moment on the right side of mirror |
| $V_{AC1}$ | Amplitude of first AC source |
| $V_{AC2}$ | Amplitude of second AC source |
| $V_{DC}$ | Polarization voltage |
| $V_L$ | ΔV on the left side of mirror |
| $V_R$ | ΔV on the right side of mirror |
| a | Length of one side of mirror |
| b | Width of one side of mirror |
| $b_r$ | Width of each right side electrode |
| $b_l$ | Width of each left side electrode |
| c | Viscous damping coefficient |
| d | Gap between mirror and electrodes |
| t | Thickness of flexure beam |
| l | Length of flexure beam |
| w | Width of flexure beam |
| ε | Dielectric constant of gap medium |
| θ | Normalized tilt angle |
| α | Tilt angle of mirror |
| $\alpha_{max}$ | Maximum tilt angle of mirror |

Certain specifications related to the study of the micro mirror 400 are provided below in Table 2.

TABLE 2

| Length of the device | 2a | 535 µm |
| --- | --- | --- |
| Width of the device | b | 150 µm |
| Electrode location | $x_1$ | 97.5 µm |
| Electrode location | $x_2$ | 222.5 µm |
| Electrode location | $x_3$ | −105 µm |
| Electrode location | $x_4$ | −185 µm |
| Smaller electrode thickness | $b_l$ | 30 µm |

TABLE 2-continued

| | | | |
|---|---|---|---|
| Larger electrodes thickness | $b_r$ | 42.5 | μm |
| Flexure beam length | l | 100 | μm |
| Flexure beam width | w | 15 | μm |
| Flexure beam thickness | t | 5 | μm |
| Gap | d | 5 | μm |
| Damping ratio | | 0.02 | |
| Pull in voltage for right half | | 18.4 | volts |

The micro mirror 400 is modeled using lumped parameter techniques. The dynamic model of the micro mirror 400 can be expressed as:

$$I\ddot{\theta} + c\dot{\theta} + K_t\theta = M_R - M_L \quad (1)$$

where $$M_R = \frac{\varepsilon b_r V_R}{2\alpha^2}\left[\frac{d}{(d - x_2\alpha)} - \frac{d}{(d - x_1\alpha)} + \ln\left\{\frac{(d - x_2\alpha)}{(d - x_1\alpha)}\right\}\right], \quad (2)$$

$$M_L = \frac{\varepsilon b_l V_L}{2\alpha^2}\left[\frac{d}{(d - x_4\alpha)} - \frac{d}{(d - x_3\alpha)} + \ln\left\{\frac{(d - x_4\alpha)}{(d - x_3\alpha)}\right\}\right], \quad (3)$$

and $$V_R = V_L[V_{DC} + V_{AC1}\cos(\Omega_1) + V_{AC2}\cos(\Omega_2)]^2. \quad (4)$$

The torsional stiffness $K_t$ of the flexures can be calculated as:

$$K_t = \frac{2GJ_P}{l} \quad (5)$$

$J_P$ can be calculated as:

$$J_P = \frac{1}{3}wt^3\left(1 - \frac{192t}{\pi^5 w}\sum_0^\infty \frac{1}{[2n + 1]^5}\tanh\left[\frac{(2n + 1)\pi w}{2t}\right]\right). \quad (6)$$

Next, the following normalized parameters are introduced:

$$\theta = \frac{\alpha}{\alpha_{max}} \quad (7)$$

$$\alpha_{max} = \frac{d}{a} \quad (8)$$

$$\gamma_1 = \frac{x_1}{\alpha}; \quad (9)$$

$$\gamma_2 = \frac{x_3}{\alpha}$$

$$\beta_1 = \frac{x_2}{\alpha}; \quad (10)$$

$$\beta_2 = \frac{x_4}{\alpha}$$

$$\hat{t} = \frac{t}{T}; \quad (11)$$

$$\mu = \frac{cT}{I};$$

$$T = \sqrt{\frac{I}{K_t}}$$

Using equations (7)-(11) above, the final normalized equation is:

$$\ddot{\theta} + \mu\dot{\theta} + \theta = \frac{\eta_1}{\theta^2}\left[\frac{1}{(1 - \beta_1\theta)} - \frac{1}{(1 - \gamma_1\theta)} + \ln\left(\frac{(1 - \beta_1\theta)}{(1 - \gamma_1\theta)}\right)\right], \quad (12)$$

$$-\frac{\eta_2}{\theta^2}\left[\frac{1}{(1 - \beta_2\theta)} - \frac{1}{(1 - \gamma_2\theta)} + \ln\left(\frac{(1 - \beta_2\theta)}{(1 - \gamma_2\theta)}\right)\right]$$

where $$\eta_1 = \frac{\varepsilon b_r V_R}{2\alpha_{max}^3 K_t}; \quad (13)$$

$$\eta_2 = \frac{\varepsilon b_l V_L}{2\alpha_{max}^3 K_t}.$$

Figure 5A:
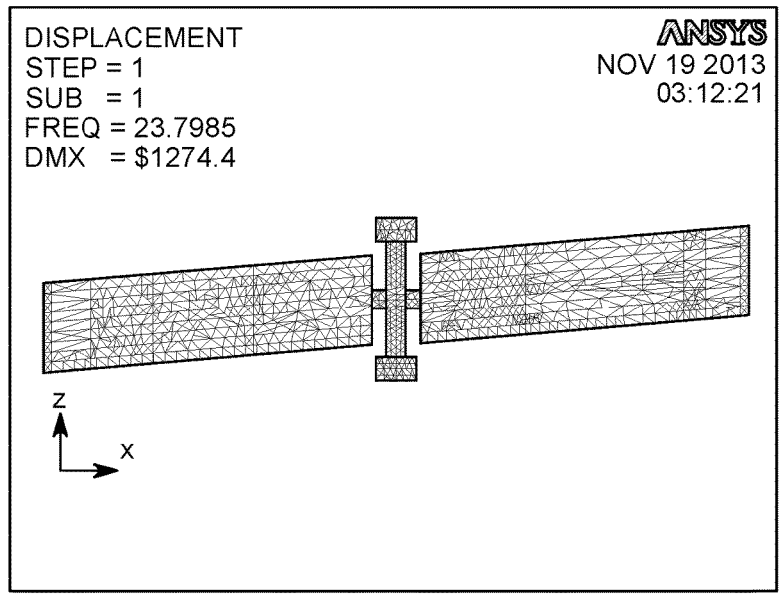
FIG. 5A illustrates an example analysis of a first resonant mode of the micro mirror in FIGS. 4A-4C.
Figure 5B:
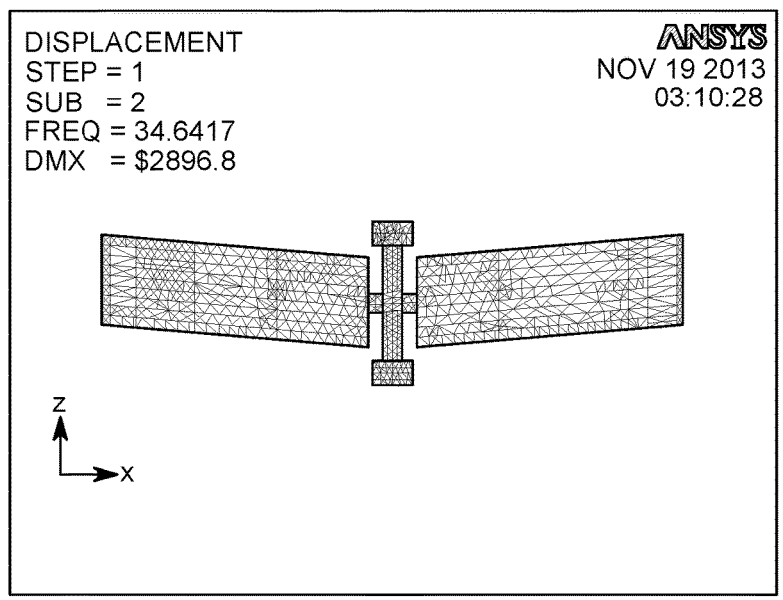
FIG. 5B illustrates an example analysis of a second resonant mode of the micro mirror in FIGS. 4A-4C.
Figure 5C:
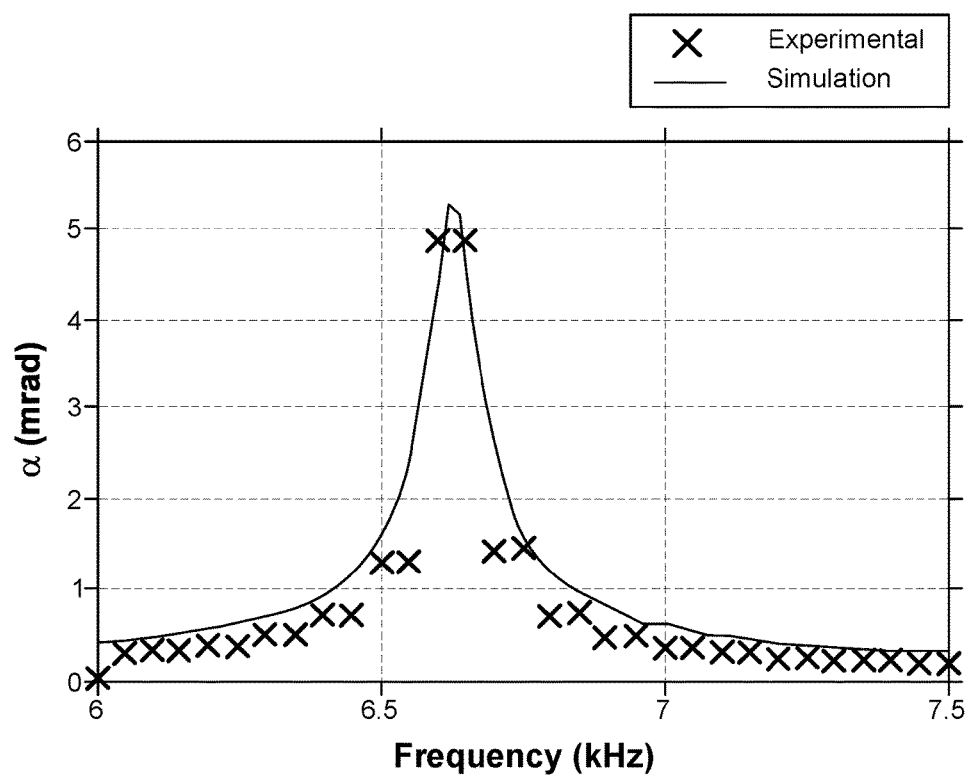
FIG. 5C illustrates experimental and theoretical calculated natural frequencies consistent with that of the finite element results.

The natural frequencies of the micro mirror 400 were calculated using the ANSYS® finite element software. The primary resonance frequency was found at 6.71 kHz. Also, a first resonant mode was found at 23.8 kHz, as illustrated in FIG. 5A, and a second resonant mode was found at 34.64 kHz, as illustrated at FIG. 5B. FIG. 5C illustrates experimental and theoretical calculated natural frequencies consistent with that of the finite element results.

Figure 6:
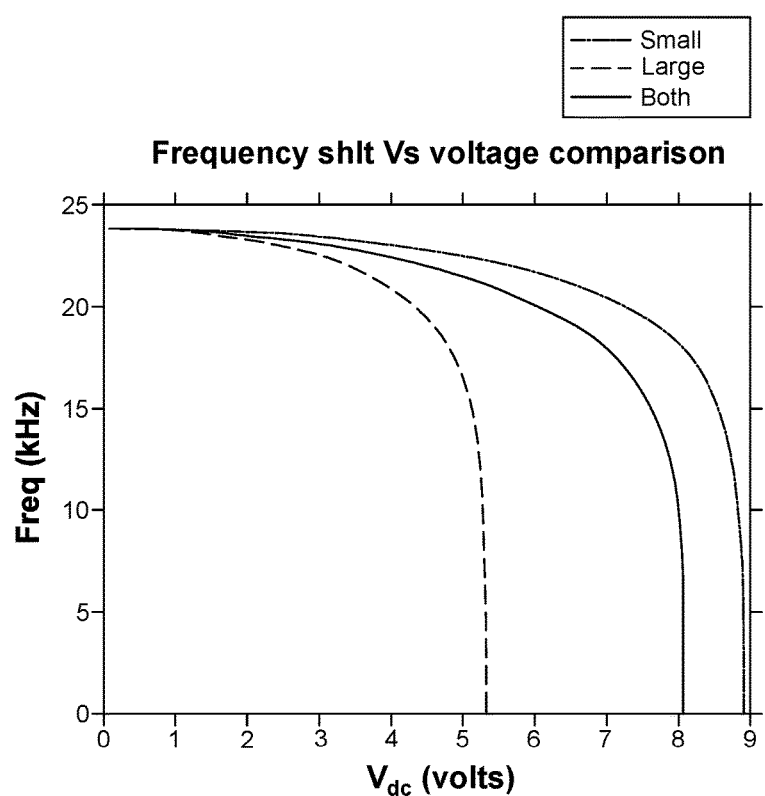
FIG. 6 illustrates a representative comparison between the operating frequencies of the micro mirror in FIGS. 4A-4C based on the different ways of actuating the micro mirror.

FIG. 6 illustrates a representative comparison (i.e., shift) between the operating frequencies of the micro mirror 400 in FIGS. 4A-4C based on the different ways of actuating the micro mirror 400. Particularly, FIG. 6 illustrates the impact of the various actuation methods (e.g., left side only, right side only, and both right and left sides) verses voltage. As shown in FIG. 6, the micro mirror 400 can have three different natural frequencies at a single voltage by biasing either the right side, the left side, or both sides of the micro mirror 400. Similarly, it should be appreciated that a resonance frequency of the micro mirror 400 can be achieved or approached using different actuation methods.

Figure 7:
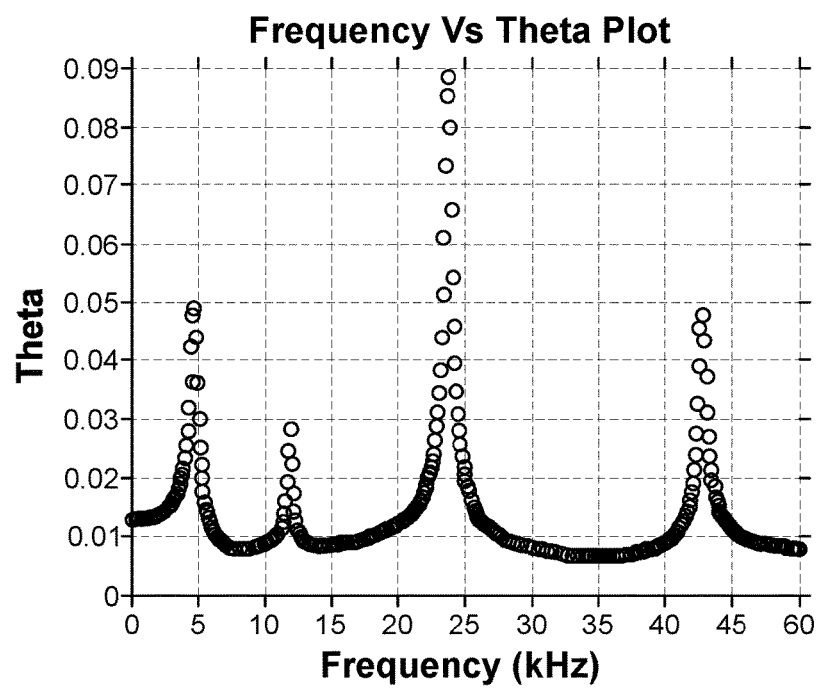
FIG. 7 illustrates a frequency response of the micro mirror in FIGS. 4A-4C based on a first set of multi-frequency excitation operating parameters.

The micro mirror 400 in FIGS. 4A-4C, having the specifications outlined above in Table 2, is evaluated in further detail below. The quality factor of the micro mirror 400 can be assumed to be 100. FIG. 7 illustrates a frequency response of the micro mirror 400 based on a first set of multi-frequency excitation operating parameters. As the first set of operating parameters, $V_{DC}$ is set to 0.5 V, $V_{AC1}$ is set to 0.5 V, $V_{AC2}$ is set to 0.5 V, $\Omega_1$ is set to 19 kHz, and $\Omega_2$ is swept over a wide frequency range. It is noted that the resulting frequency response curve illustrated in FIG. 7 shows a resonance of additive type at about 5 kHz, a resonance of the subtractive type at about 43 kHz, the natural frequency of the micro mirror 400 at about 23.8 kHz, and a super harmonic of the micro mirror 400 at about half the natural frequency.

Figure 8:
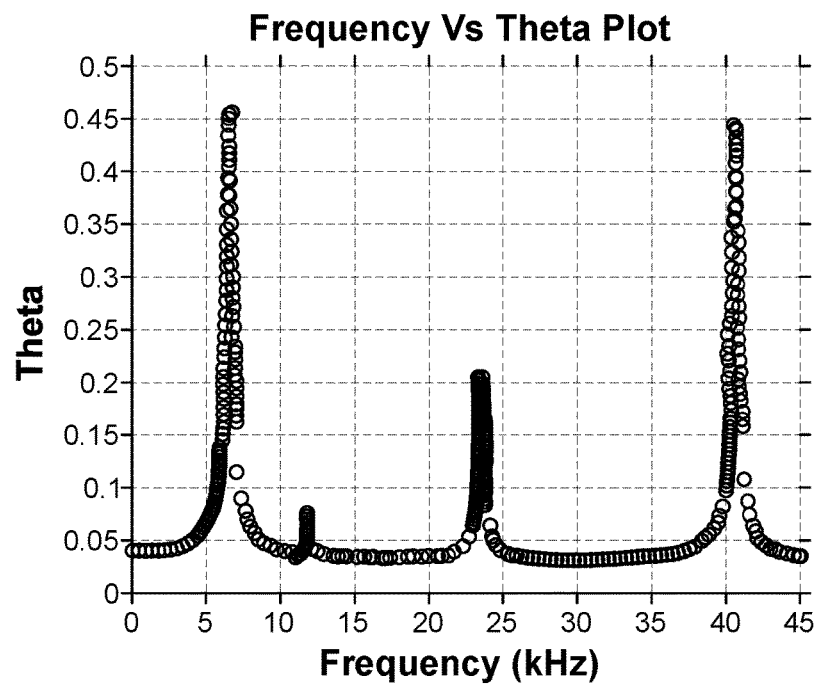
FIG. 8 illustrates a frequency response of the micro mirror in FIGS. 4A-4C based on a second set of multi-frequency excitation operating parameters.

To further investigate the behavior of the micro mirror 400, the response of the micro mirror 400 to variations in input voltages is studied. Particularly, the voltage applied by way of the fixed frequency excitation source is increased to 2.4 V while the rest of the parameters are left unchanged. FIG. 8 illustrates a frequency response of the micro mirror 400 based on this second set of multi-frequency excitation operating parameters. As the second set of operating parameters, $V_{DC}$ is set to 0.5 V, $V_{AC1}$ is set to 2.4 V, $V_{AC2}$ is set to 0.5 V, $\Omega_1$ is set to 17 kHz, and $\Omega_2$ is swept over a wide frequency range. FIG. 8 shows the additive and subtractive type resonances having higher amplitude than the primary resonance frequency. Thus, by using multi-frequency excitation, the dominant resonance spike of the micro mirror 400 can be shifted, which is traditionally only possible by changing the geometry of the device and refabricating it. In the context of FIG. 8, it is noted that the methods of multi-frequency excitation described herein can include selecting a voltage amplitude of a first source of excitation for a device, and adjusting the voltage amplitude of the first source of excitation to adjust a response of at least one of additive or subtractive type resonances of the device.

Figure 9:
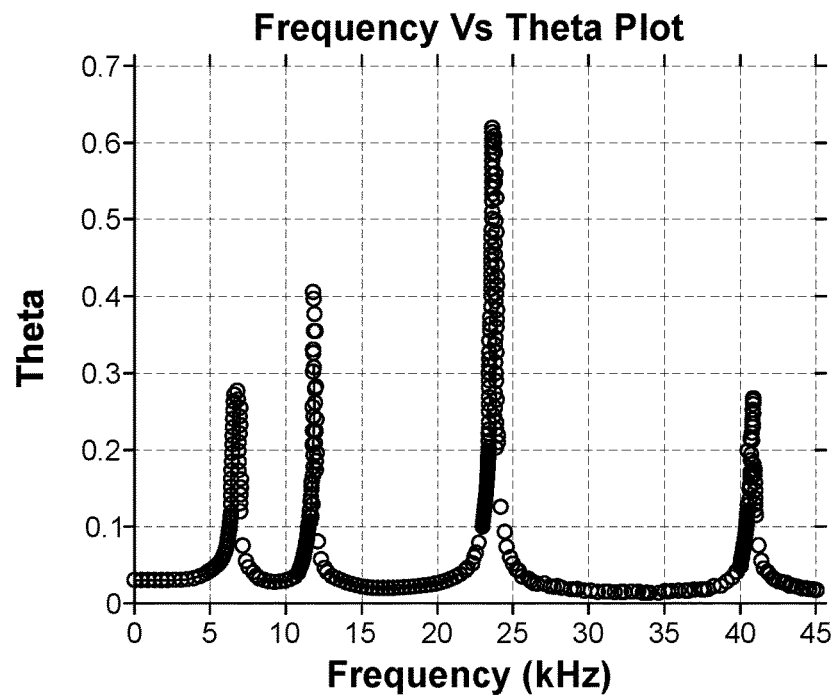
FIG. 9 illustrates a frequency response of the micro mirror in FIGS. 4A-4C based on a third set of operating parameters.

Further investigating the effect of change in voltages, the voltage applied by way of the sweeping frequency excitation source is increased to 1.5 V in a third set of multi-frequency excitation operating parameters. FIG. 9 illustrates a frequency response of the micro mirror 400 based on this third set of operating parameters. As the third set of operating parameters, $V_{DC}$ is set to 0.5 V, $V_{AC1}$ is set to 0.5 V, $V_{AC2}$ is set to 1.5 V, $\Omega_1$ is set to 6 kHz, and $\Omega_2$ is swept over a wide frequency range. The response in FIG. 9 shows the amplitudes of the resonances at the natural and super harmonic frequencies surpassing the additive and subtractive resonances. Here, it is found that, as compared to the natural and super harmonic frequencies, the additive and subtractive resonances are less sensitive to an increase in amplitude of the excitation sources. When comparing FIGS. 8 and 9, it is also evident that the maximum amplitudes of the additive and subtractive resonances at $V_{AC1}$=2.4 V are less that of the maximum amplitudes of the natural and super harmonic frequencies at $V_{AC2}$=1.5 V. In the context of FIG. 9, it is noted that the methods of multi-frequency excitation described herein can include selecting a voltage amplitude of a second source of excitation for a device, and adjusting the voltage amplitude of the second source of excitation to adjust a response of a natural frequency of the device.

From the results outlined above, it is established that additive and subtractive type resonances can be activated in the micro mirror 400 at various frequencies. Further, an increase in the amplitude of the additive or subtractive type resonances may be achieved by increasing the voltage of the fixed frequency, and the amplitude of the resonances at the natural and super harmonic frequencies can be achieved by increasing the voltage of the sweeping frequency. The ability to achieve multiple resonances and control both the position and amplitude of the resonances without changing the geometry of a device can have wide applications in MEMS.

Figure 10:
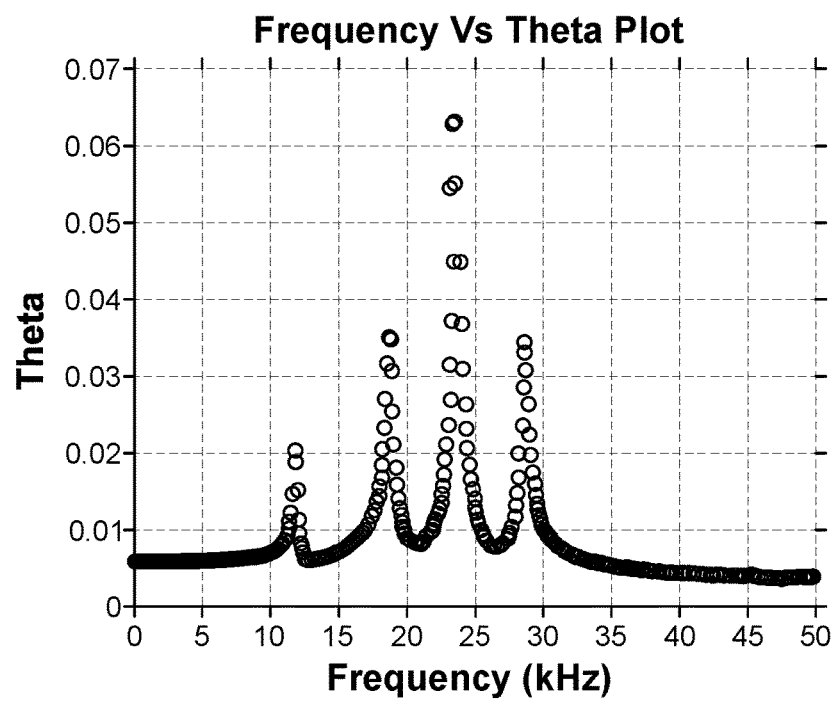
FIG. 10 illustrates a frequency response of the micro mirror in FIGS. 4A-4C having resonance peaks relatively close to the natural frequency of the micro mirror, under a fourth set of multi-frequency excitation operating parameters.

By observing the conditions for activating additive and subtractive resonances, it is noticed that, the closer the fixed excitation frequency is to zero, the closer the resonance peaks will be to the natural frequency of the system. FIG. 10 illustrates a frequency response of the micro mirror 400 having resonance peaks relatively close to the natural frequency of the micro mirror 400, under a fourth set of multi-frequency excitation operating parameters. As the fourth set of operating parameters, $V_{DC}$ is set to 0.5 V, $V_{AC1}$ is set to 0.5 V, $V_{AC2}$ is set to 0.5 V, $\Omega_1$ is set to 5 kHz, and $\Omega_2$ is swept over a wide frequency range. In FIG. 10, the fixed multi-excitation frequency is at 5 kHz, and resonant peaks are found at 19 kHz and 29 kHz, approximately. Achieving resonance peaks relatively close to the natural frequency of the system can result in an increased operating bandwidth for the system.

Figure 11:
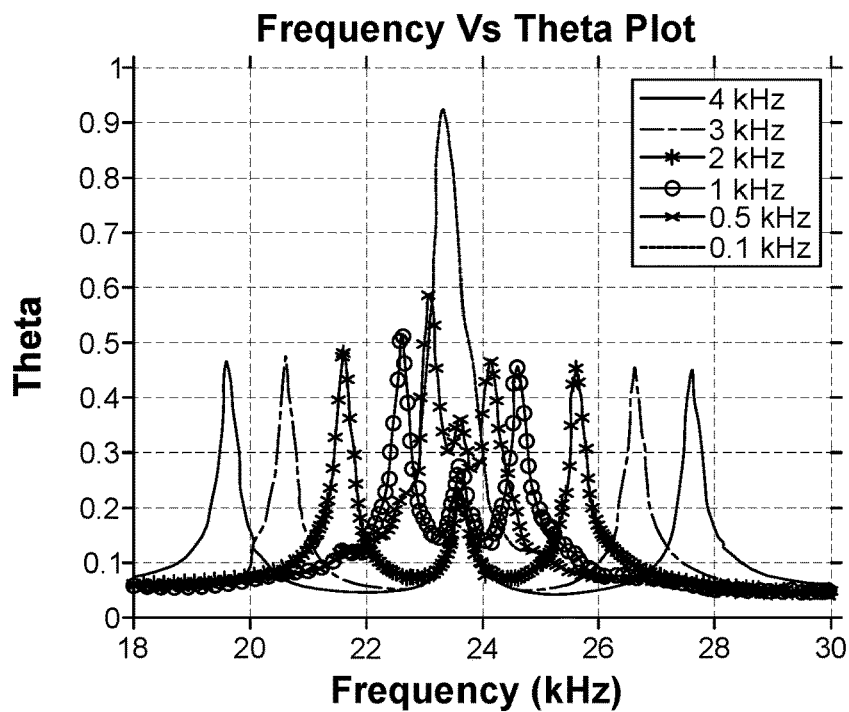
FIG. 11 illustrates a plot showing increased bandwidth for different fixed excitation frequencies close to the natural frequency of the micro mirror in FIGS. 4A-4C, under a fifth set of multi-frequency excitation operating parameters.

FIG. 11 illustrates a plot showing increased bandwidth for different fixed excitation frequencies close to the natural frequency of the micro mirror 400, under a fifth set of multi-frequency excitation operating parameters. As the fifth set of operating parameters, $V_{DC}$ is set to 0.5 V, $V_{AC1}$ is set to 2.4 V, $V_{AC2}$ is set to 0.5 V, $\Omega_1$ is set to 4, 5, 2, 1, 0.5, and 0.1 kHz, and $\Omega_2$ is swept over a wide frequency range. Here, since a higher voltage fixed excitation frequency is applied, the additive and subtractive type resonance peaks have higher amplitudes.

Figure 12:
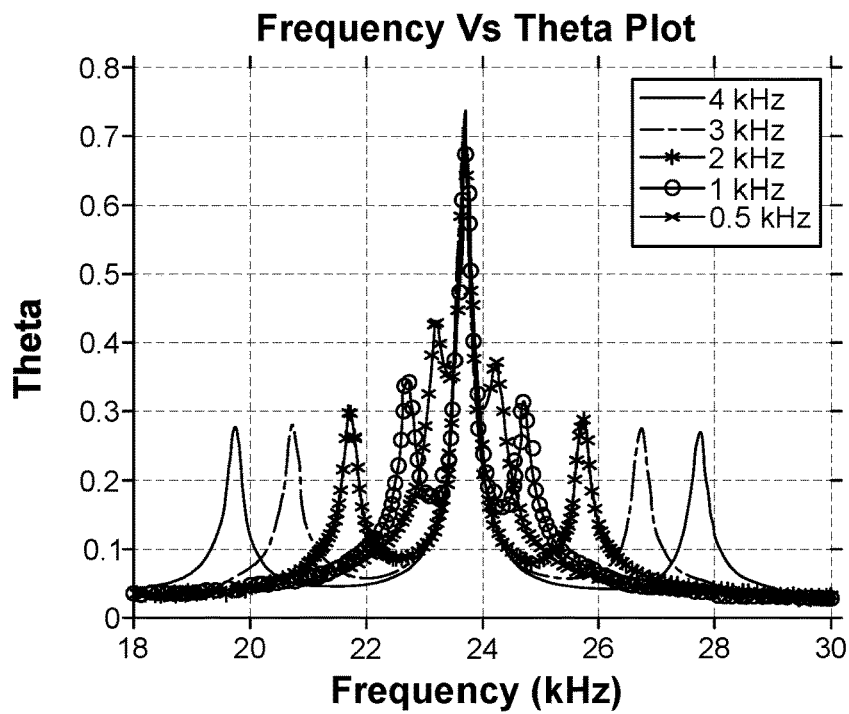
FIG. 12 illustrates a plot showing increased bandwidth for different fixed excitation frequencies close to the natural frequency of the micro mirror in FIGS. 4A-4C, under a sixth set of multi-frequency excitation operating parameters.

FIG. 12 illustrates a plot showing increased bandwidth for different fixed excitation frequencies close to the natural frequency of the micro mirror 400, under a sixth set of multi-frequency excitation operating parameters. As the sixth set of operating parameters, $V_{DC}$ is set to 0.5 V, $V_{AC1}$ is set to 0.5 V, $V_{AC2}$ is set to 1.5 V, $\Omega_1$ is set to 4, 5, 2, 1, 0.5, and 0.1 kHz, and $\Omega_2$ is swept over a wide frequency range. In FIG. 12, since a higher voltage sweeping excitation frequency is applied, a higher natural resonance (at about 24 kHz) is achieved with smaller additive and subtractive resonance peaks surrounding the natural resonance.

Figure 13:
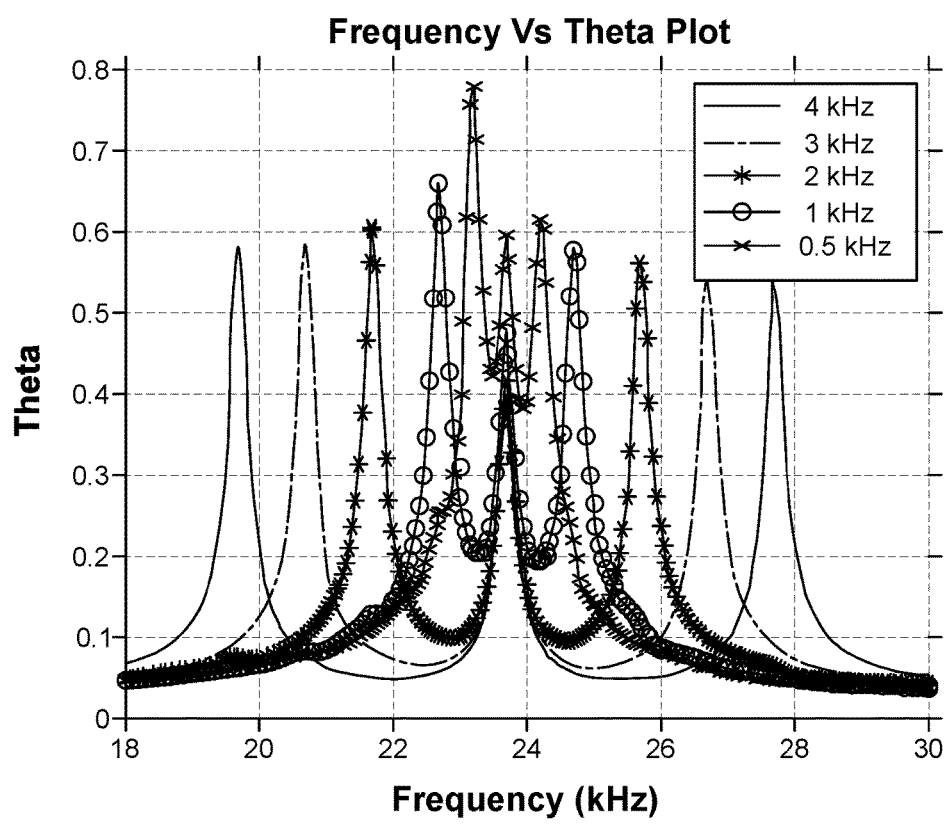
FIG. 13 illustrates a plot showing several resonance peaks of the micro mirror in FIGS. 4A-4C having almost the same amplitude, under an seventh set of multi-frequency excitation operating parameters.

FIG. 13 illustrates a plot showing several resonance peaks of the micro mirror 400 having almost the same amplitude, under a seventh set of multi-frequency excitation operating parameters. As the seventh set of operating parameters, $V_{DC}$ is set to 0.5 V, $V_{AC1}$ is set to 1.5 V, $V_{AC2}$ is set to 1 V, 1, $\Omega_1$ is set to 4, 5, 2, 1, 0.5, and 0.1 kHz, and $\Omega_2$ is swept over a wide frequency range. As shown FIG. 13, a balance between $V_{AC1}$ and $V_{AC2}$ can be found where several resonance peaks have almost the same amplitude. The response in FIG. 13 can be relied upon to provide resonators with large bandwidth. The response in FIG. 13 may also prove to be very useful for energy harvesting applications, because such as response can provide a wide bandwidth suitable for ambient vibration energy harvesting.

Figure 14:
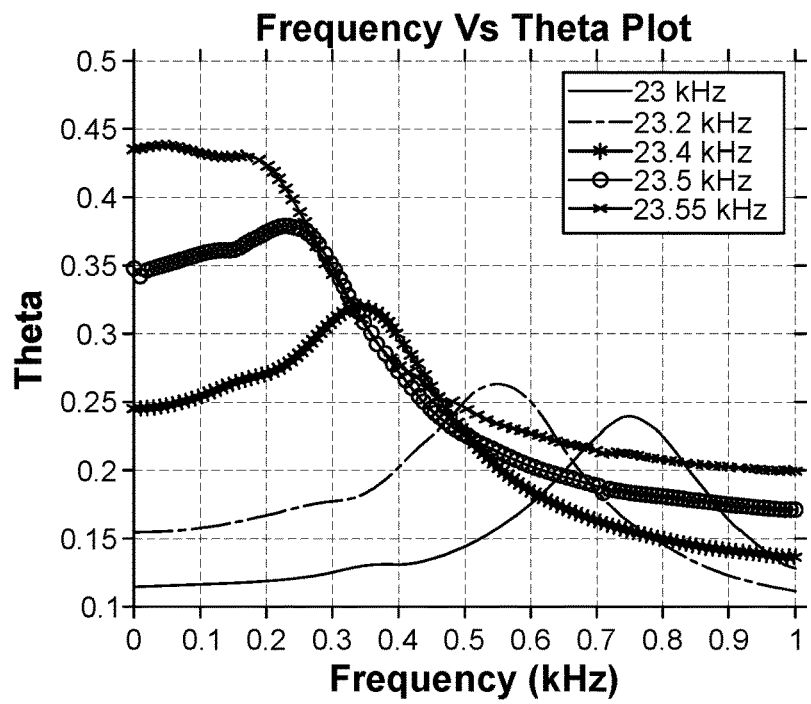
FIG. 14 illustrates a plot showing the generation of high bandwidth peaks as the fixed excitation frequency approaches the primary resonance of the micro mirror in FIGS. 4A-4C.
Figure 15:
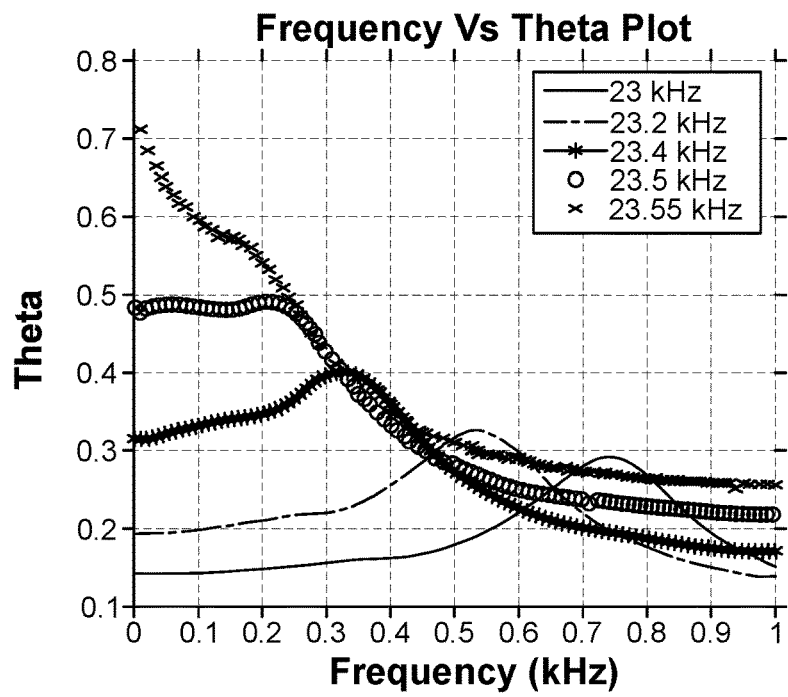
FIG. 15 illustrates another plot showing the generation of high bandwidth peaks as the fixed excitation frequency approaches the primary resonance of the micro mirror in FIGS. 4A-4C.

As described above, selecting the fixed frequency $\Omega_1$ close to zero results in a high bandwidth. Similarly, selecting the fixed frequency $\Omega_1$ close to the natural frequency of the device provides a high amplitude near $\omega_n$=0. FIG. 14 illustrates a plot showing the generation of high bandwidth peaks as the fixed excitation frequency approaches the primary resonance of the micro mirror 400. As the operating parameters for the plot in FIG. 14, $V_{DC}$ is set to 0.5 V, $V_{AC1}$ is set to 1 V, $V_{AC2}$ is set to 0.5 V, $\Omega_1$ is set to 23, 23.2, 23.4, 23.5, and 23.55 kHz, and $\Omega_2$ is swept over a wide frequency range. FIG. 15 illustrates another plot showing the generation of high bandwidth peaks as the fixed frequency approaches the primary resonance. As the operating parameters for the plot in FIG. 15, $V_{DC}$ is set to 0.5 V, $V_{AC1}$ is set to 1.2 V, $V_{AC2}$ is set to 0.5 V, $\Omega_1$ is set to 23, 23.2, 23.4, 23.5, and 23.55 kHz, and $\Omega_2$ is swept over a wide frequency range.

As illustrated between FIGS. 14 and 15, the generation of the resonance peaks is sensitive to the initial fixed frequency. However the higher the amplitude, the smaller the bandwidth, as shown in FIG. 15. The peak for 23.55 kHz is closest to the natural frequency and has the higher amplitude but less bandwidth as compared to that in FIG. 14. Thus, a high amplitude response within the 0-200 Hz range can be achieved from a device having a natural frequency in the kHz range. Accordingly, using the multi-frequency excitation techniques described herein, devices having natural frequencies in the kHz range can be used in electrostatic energy harvesting, for example, without designing low frequency structures.

Figure 16:
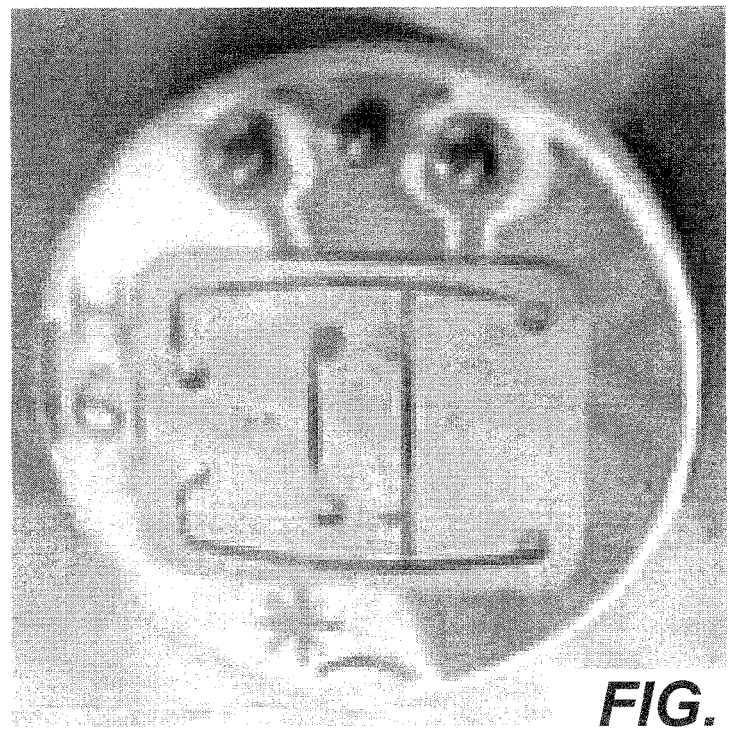
FIG. 16 illustrates a MEMS accelerometer evaluated using multi-frequency excitation techniques according to various embodiments described herein.

As another study of the multi-frequency excitation embodiments described herein, the dynamics of an electrostatically biased MEMS accelerometer are evaluated when constant and swept multi-frequency excitation sources are applied to the MEMS accelerometer. FIG. 16 illustrates the MEMS accelerometer evaluated using multi-frequency excitation techniques. The upper electrode of the MEMS accelerometer has a rectangular shape, with a length of 9 mm, a width of 5.32 mm, and a thickness of 150 μm. The lower electrode of MEMS accelerometer is placed directly underneath the proof mass on a ceramic substrate. It has the same length, but a slightly smaller width at 4.4 mm. The separation gap between the two electrodes is 37 μm. The lower electrode provides both electrostatic (i.e., $V_{DC}$) and electrodynamic (i.e., $V_{AC}$) actuation.

Figure 17:
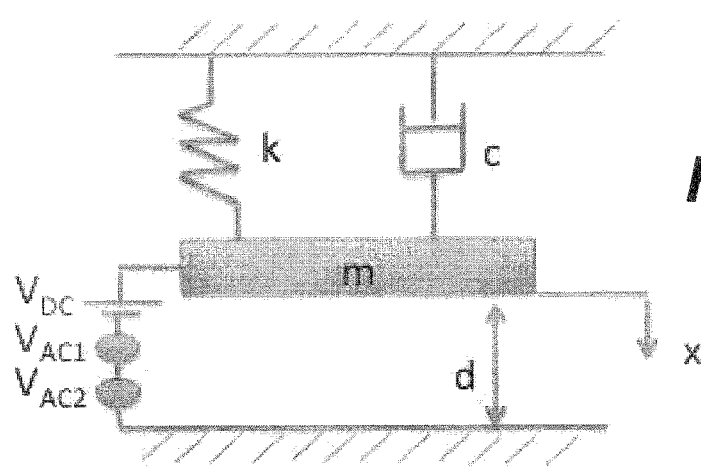
FIG. 17 illustrates a theoretical single degree-of-freedom spring-mass model derived for the MEMS accelerometer in FIG. 16.

Further, a theoretical single degree-of-freedom spring-mass model is derived for the MEMS accelerometer, as illustrated in FIG. 17. The model consists of a proof mass suspended by two cantilever beams. When electrically excited, the proof mass oscillates in the out-of-plane direction (i.e., out of the plane of the ceramic). Although some dimensions of the MEMS accelerometer are in millimeters, it has some characteristics of a MEMS device. In particular, the separation gap and thickness of the upper electrode are in the range of microns and the structure can be electrically actuated. Different from other devices, the MEMS accelerometer has the advantage of being more likely to survive the repetitive failures due to pull-in, which allows thorough experimental investigation.

Figure 18:
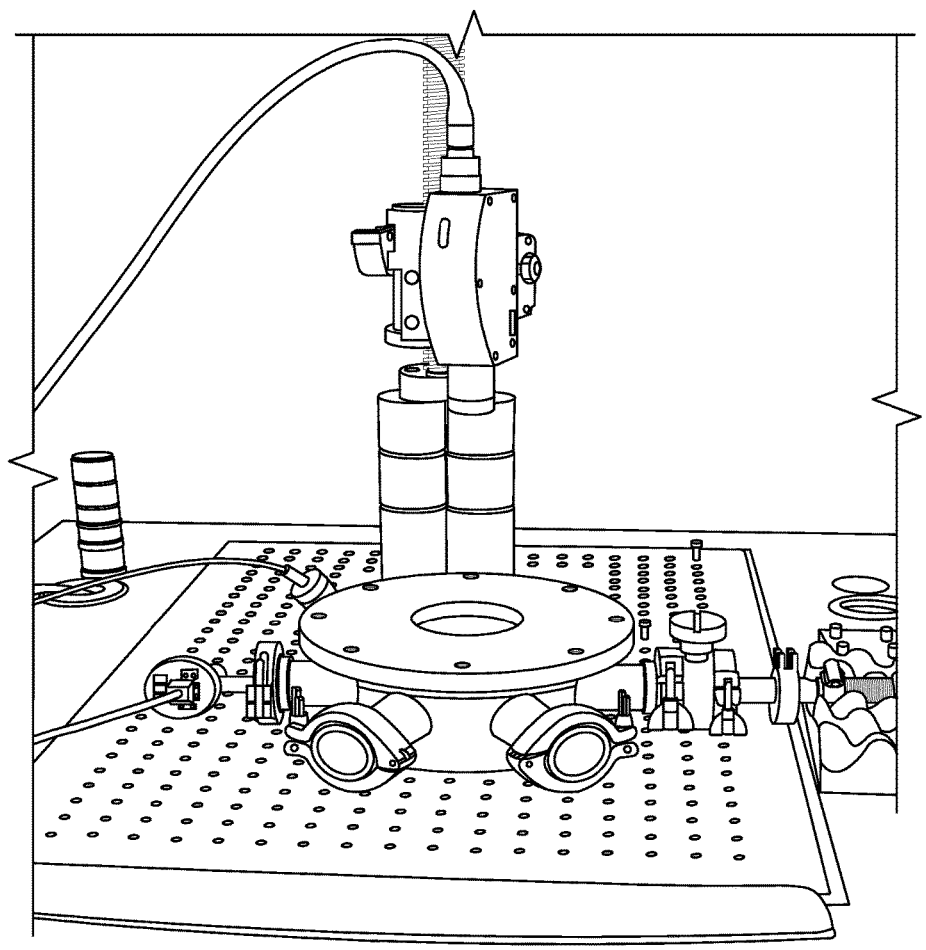
FIG. 18 illustrates an experimental set-up used for testing the MEMS accelerometer in FIG. 16.

FIG. 18 illustrates an experimental setup used for testing the MEMS accelerometer illustrated in FIG. 16. The setup consists of a laser Doppler vibrometer, a Lab View data acquisition system, AC and DC power sources, a vacuum chamber, and a high vacuum pump. The MEMS accelerometer is inserted inside the vacuum chamber, which is placed underneath the laser Doppler vibrometer, so that it can measure the deflection of the proof mass. The chamber is equipped with a viewport window of quartz glass on top and other ports located on the sides. The viewport window enables the laser to penetrate without any distortion. The lateral ports, instead, serve to supply pressure gauge and electrical connections. The lateral ports are used to couple the chamber to the high vacuum pump and to apply the AC and DC power sources, which are provided via the LabView data acquisition system.

Referring again to FIG. 17, in the spring-mass model, the MEMS accelerometer is modeled as a parallel plate capacitor with two rigid plates, where the upper one is movable. The lumped mass represents the proof mass and the spring represents the two cantilever beams. The resulting governing equation of motion for the model is given by:

$$m\ddot{x} + c(x)\dot{x} + kx = \varepsilon_0 \varepsilon_r A \frac{[V_{DC} + V_{AC1}\cos(\Omega_1 t) + V_{AC2}\cos(\Omega_2 t)]^2}{2(d-x)^2}, \quad (14)$$

where x is the deflection of the proof mass, m is its mass, c is the viscous damping coefficient due to the squeeze film effect, k is the linear effective stiffness of the cantilever beams, $\varepsilon_0$ is the dielectric constant in the free space, $\varepsilon_r$ is the relative permittivity of the gap space medium (air) with respect to the free space, A is the lower electrode area, d is the separation gap width, $V_{DC}$, $V_{AC1}$, and $V_{AC2}$ are fixed and alternating voltage sources, $\Omega_2$ is the fixed excitation frequency, $\Omega_1$ is the excitation frequency being swept, t is time, and the superscript dot denotes time derivative.

The unknown parameters of equation (14) are: k, m, and c. To identify them, both the weight effects of the proof mass and the static effects of the $V_{AC1}$ and $V_{AC2}$ voltages can be disregarded, since their contribution is not relevant. To extract the stiffness coefficient k, the static bifurcation diagram for the model can be referenced, and the experimental and theoretical predictions may be matched.

The MEMS accelerometer can be biased with ramping $V_{DC}$ inputs while the stable static deflection of the proof mass is measured up to the static pull-in phenomenon. The static pull-in voltage $V_{DC\_pull-in}$ is observed at about 90 V. Focusing on the spring-mass model Eq. (14) in the static case, from simple computations, it can be proven that the stiffness coefficient k is:

$$k = \varepsilon_0 \varepsilon_r A \frac{[V_{DC\_pull-in}]^2}{2d^3(4/27)}. \quad (15)$$

Based on these considerations, k may be identified as 170 $Nm^{-1}$. Further, to determine the effective mass m of the proof mass, it is noted that the first symmetric natural frequency experimentally occurs at about 193.5 Hz. Recalling that $m=k/\omega^2$ when neglecting the static effects, the effective mass m of the proof mass is estimated at 0.147 g, and c=0.000345.

The response behavior of the MEMS accelerometer in the neighbourhood of the resultant summation and subtraction multi-excitation frequencies is analysed, to investigate the dynamic features arising in the system response when both the frequencies are subtracted ($\omega_n-\Omega_2$) and when both of the frequencies are summed ($\omega_n+\Omega_2$). In this contest, several frequency sweeps are performed while applying a sinusoidal signal of certain frequency ($\Omega_2$). Each sweep is acquired by keeping the voltages $V_{AC1}$ and $V_{AC2}$ as constants, while the frequency ($\Omega_1$) is increased (i.e., forward sweep) slowly, to maintain a steady-state condition at the end of each step.

Figure 19A:
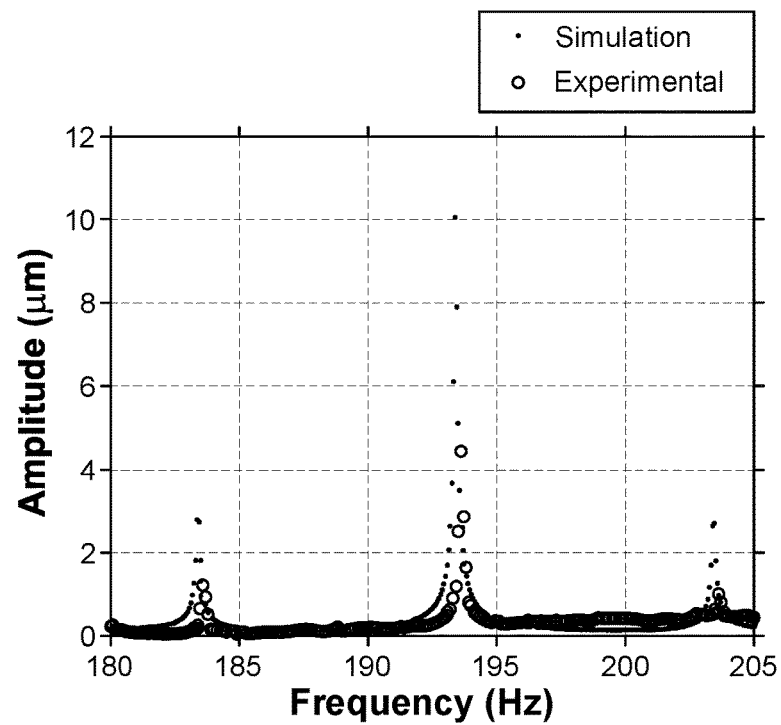
FIG. 19A illustrates a frequency response curve for the MEMS accelerometer in FIG. 16 based on a particular set of multi-frequency excitation operating parameters.
Figure 19B:
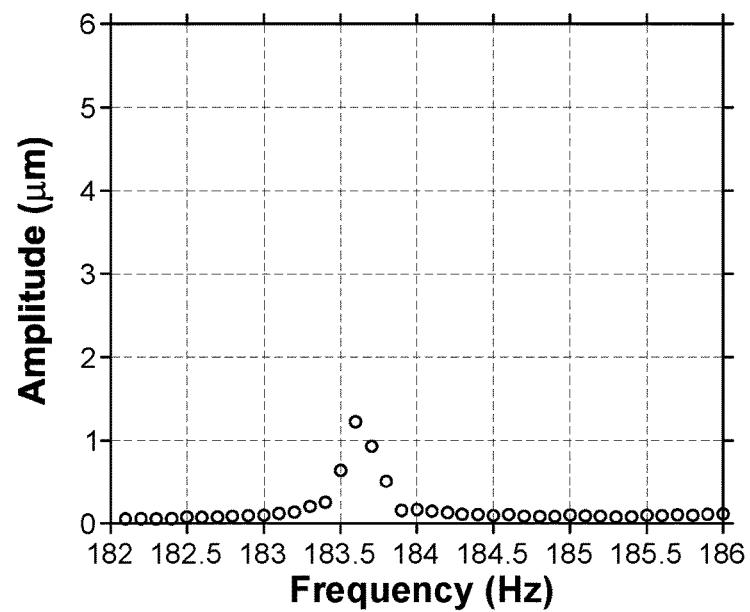
FIG. 19B illustrates the frequency response curve in FIG. 19A, zoomed in at a certain frequency.

FIG. 19A illustrates a frequency response curve for the MEMS accelerometer in FIG. 16 based on a particular set of multi-frequency excitation operating parameters. As the particular set of operating parameters, $V_{DC}$ is set to 4 V, $V_{AC1}$ is set to 1 V, $V_{AC2}$ is set to 2 V, $\Omega_1$ is swept, and $\Omega_2$ is set at 10 Hz. FIG. 19B illustrates the frequency response curve in FIG. 19A, zoomed in at $\omega_n+\Omega_2$. In FIG. 4A, the typical resonant behavior around 193.5 Hz can be seen with the increase in the amplitude of the resonant oscillations. Also, the smaller peaks for the combination resonances of additive and subtractive type can be seen. In FIG. 19B, a zoom in to the combination resonance at 183.5 Hz can be seen. These combination resonances copy the behavior of the fundamental natural frequency. For example, if there is a softening behavior, the combination resonances exhibit a softening behavior. Also, this is applies to any hardening behavior.

Figure 20:
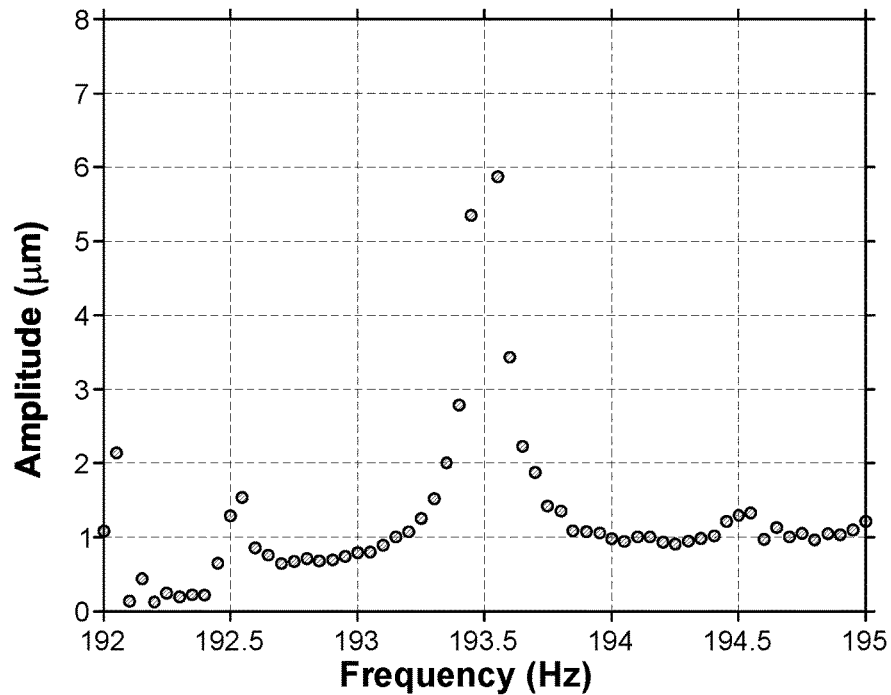
FIG. 20 illustrates a frequency response curve for the MEMS accelerometer in FIG. 16 based on a different set of multi-frequency excitation operating parameters.
Figure 21:
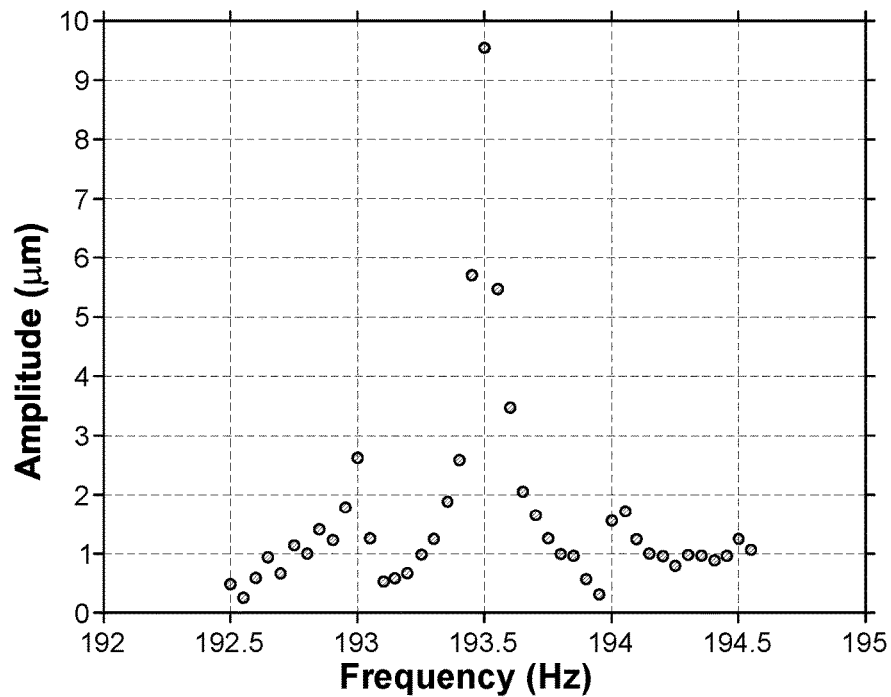
FIG. 21 illustrates a frequency response curve for the MEMS accelerometer in FIG. 16 based on another set of multi-frequency excitation operating parameters.

FIG. 20 illustrates a frequency response curve for the MEMS accelerometer in FIG. 16 based on a different set of multi-frequency excitation operating parameters. As for the different set of operating parameters, $V_{DC}$ is set to 6 V, $V_{AC1}$ is set to 2 V, $V_{AC2}$ is set to 2 V, $\Omega_1$ is swept, and $\Omega_2$ is set at 1 Hz. As illustrated in FIG. 20, the level between the primary resonance and the combination resonances has increased to a measurable level (e.g., 1 μm). If more DC voltage is applied, this level may be increased for use as wider band pass filter. Finally, in FIG. 21, the biased constant frequency is reduced to 0.5 Hz, and the shape of broader bandwidth starts to develop. Here, it is noted that applying many small frequencies may be relied upon to create a desired bandwidth for a band pass filter.

In the additional results presented below, the combination resonances look similar to that which was expected due to the presence of quadratic nonlinearity. Although the micro mirror 400 has quadratic nonlinearity coming from electrostatic force, a much stronger effect comes from mixed forcing terms introduced through quadratic electrostatic force. To better understand this, the quadratic voltage term in equation (4) can be expanded, which yields:

$$V_R = V_L = V_{DC}^2 + V_{AC1}^2 \cdot \cos^2(\Omega_1 t) + V_{AC2}^2 \cdot \cos^2(\Omega_2 t) + \quad (16)$$

-continued
$$2V_{DC} \cdot V_{AC1} \cdot \cos(\Omega_1 t) + 2V_{DC} \cdot V_{AC2} \cdot \cos(\Omega_2 t) +$$
$$V_{AC1} \cdot V_{AC2} \cdot \cos[(\Omega_1 - \Omega_2) + (\Omega_1 + \Omega_2)]t$$

It is clear from (16) that the last term is responsible for producing the resonances of additive and subtractive type.

Figure 22:
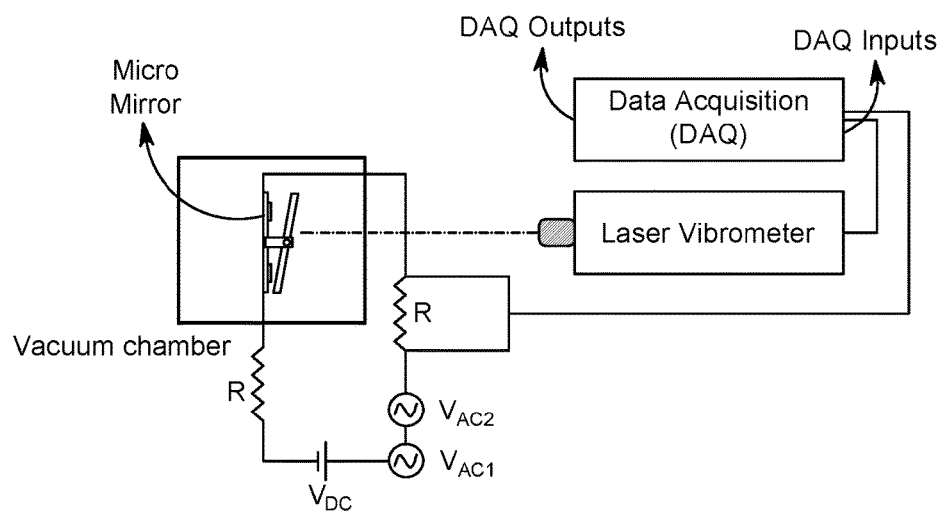
FIG. 22 illustrates a schematic of an experimental setup including a Laser Doppler Vibrometer used to obtain the experimental displacement results described below.

Next, results are shown for various loading cases, where we fix one of the AC frequencies and vary the other around the primary resonance. More particularly, the micro mirror 400 in FIGS. 4A-4C, having the specifications outlined above in Table 2, is further evaluated. FIG. 22 illustrates a schematic of an experimental setup including a Laser Doppler Vibrometer used to obtain the experimental displacement results described below. As for the simulated results provided in the examples below, they were obtained by numerically integrating equation (12) above. The results were further post processed and expressed in the form of various frequency response curves.

Figure 23:
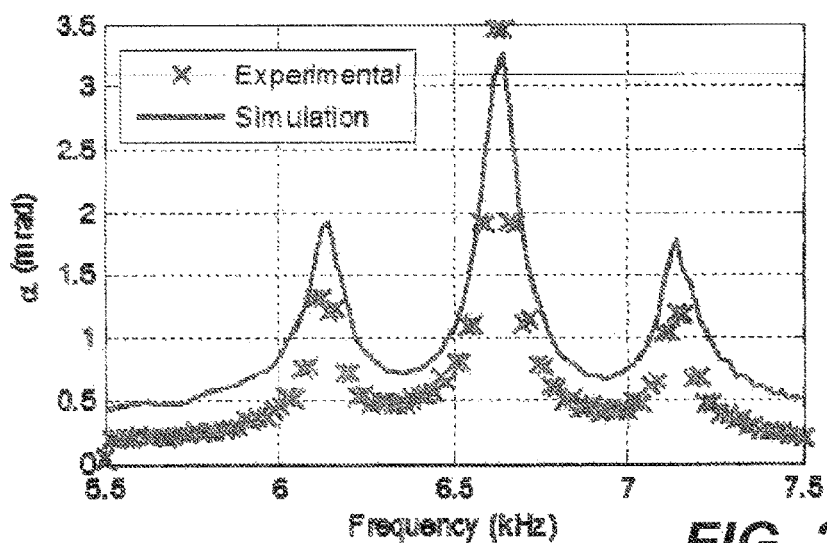
FIG. 23 illustrates a frequency response sweep of the micro mirror in FIGS. 4A-4C under an eighth set of multi-frequency excitation operating parameters.

FIG. 23 illustrates a frequency response sweep of the micro mirror in FIGS. 4A-4C under an eighth set of multi-frequency excitation operating parameters. As the eighth set of operating parameters, $V_{DC}$ is set to 2 V, $V_{AC1}$ is set to 2 V, $V_{AC2}$ is set to 1 V, $\Omega_1$ is set to 500 Hz, and $\Omega_2$ is swept over a 2 kHz frequency range around the primary resonance. FIG. 23 shows the resulting frequency response resonances of additive type at 7.1 kHz, due to the $\Omega_1+\Omega_2$ term in (14), and the subtractive type at 5.1 kHz, due to the $\Omega_1-\Omega_2$ term in (14), close to as expected. In FIG. 23, the relatively close agreement between the experimental and simulation results is noted.

Figure 24:
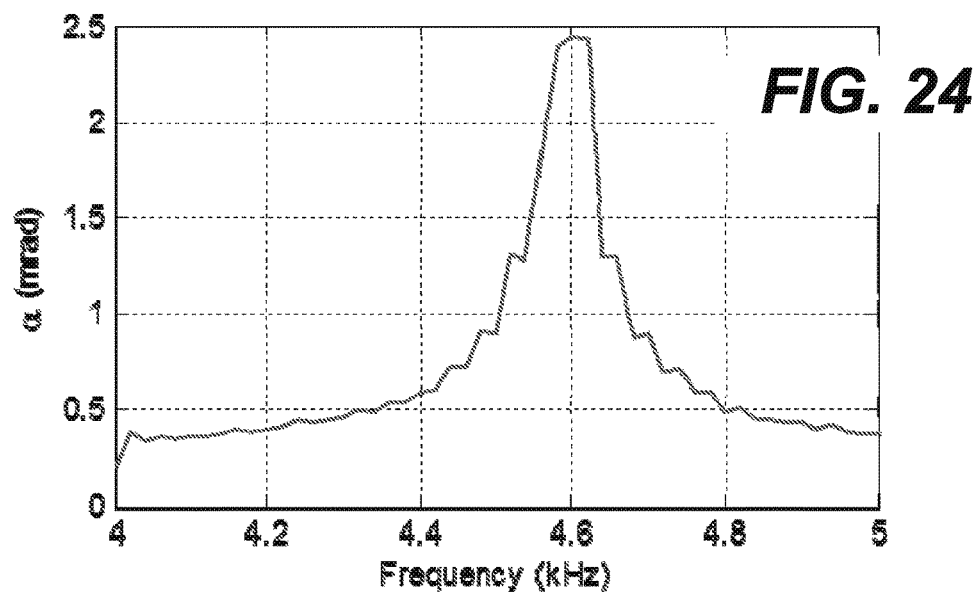
FIG. 24 illustrates a frequency response sweep of the micro mirror in FIGS. 4A-4C under a ninth set of multi-frequency excitation operating parameters.

FIG. 24 illustrates a frequency response sweep of the micro mirror in FIGS. 4A-4C under a ninth set of multi-frequency excitation operating parameters. As the ninth set of operating parameters, $V_{DC}$ is set to 2 V, $V_{AC1}$ is set to 5 V, $V_{AC2}$ is set to 1 V, and $\Omega_1$ is set to 2 kHz. Next, another case is considered to further demonstrate that shifting the additive and subtractive resonances at the desired frequencies is controlled by the fixed frequency through mixing. FIG. 24 demonstrates the experimental result for the subtractive type resonance, when $\Omega_1$ is fixed at 2 kHz. The resonances here are expected at 4.6 kHz (subtractive type) and 8.6 kHz (additive type).

Figure 25:
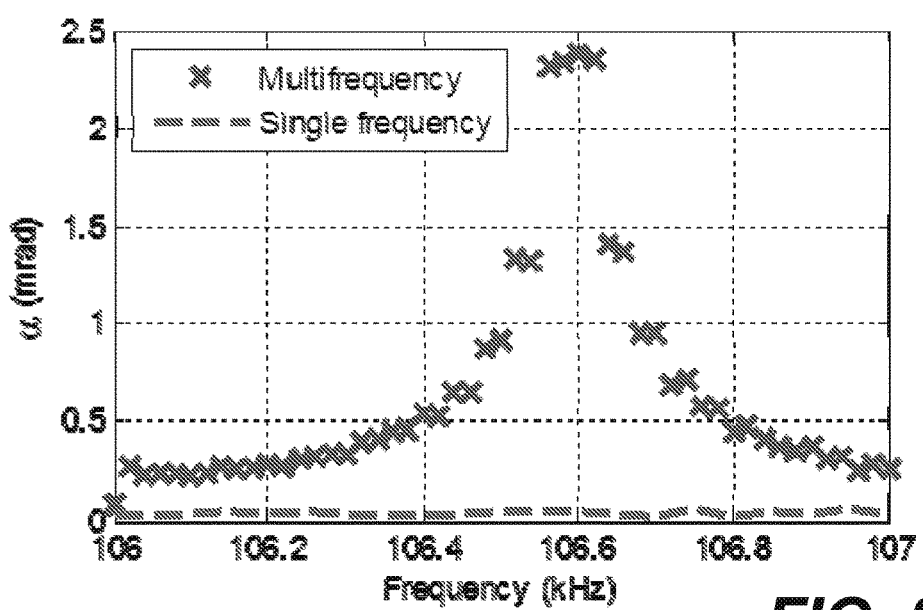
FIG. 25 illustrates a frequency response sweep of the micro mirror in FIGS. 4A-4C under a tenth set of multi-frequency excitation operating parameters.

FIG. 25 illustrates a frequency response sweep of the micro mirror in FIGS. 4A-4C under a tenth set of multi-frequency excitation operating parameters. As the tenth set of operating parameters, $V_{DC}$ is set to 2 V, $V_{AC1}$ is set to 5 V, $V_{AC2}$ is set to 1 V, and $\Omega_1$ is set to 100 kHz. Next, the behaviour of resonances at a very high fixed frequency compared to the natural frequency of the micro mirror 400 is considered. FIG. 25 compares the experimental results of this case with and without mixed-frequency excitation. Using this technique, it is possible to shift any one of the additive or subtractive type resonances to other desired frequencies. Also, a large difference in amplitude is observed between the single source and mixed-frequency excitation, which shows the effectiveness of this method.

Figure 26:
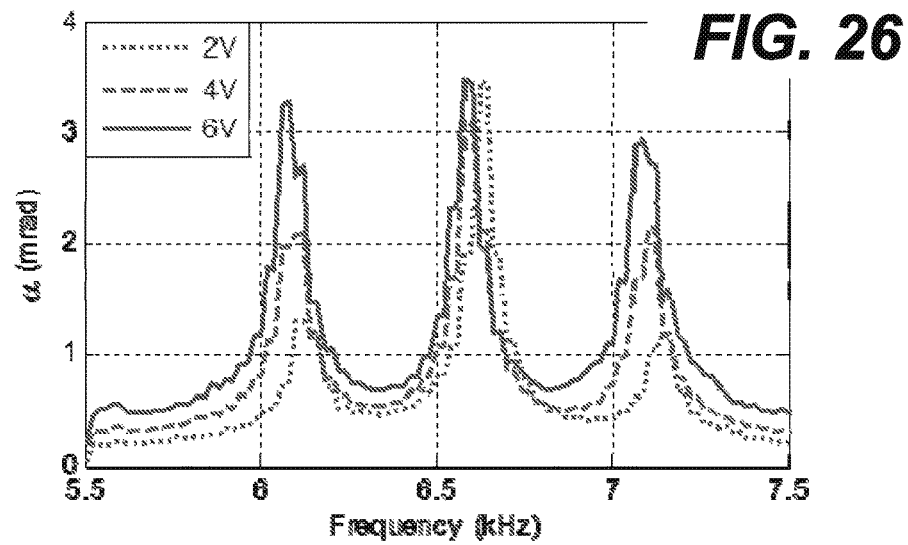
FIG. 26 illustrates a frequency response sweep of the micro mirror in FIGS. 4A-4C under an eleventh set of multi-frequency excitation operating parameters.

FIG. 26 illustrates a frequency response sweep of the micro mirror in FIGS. 4A-4C under an eleventh set of multi-frequency excitation operating parameters. As the eleventh set of operating parameters, $V_{DC}$ is set to 2 V, $V_{AC1}$ is set to 5 V, $V_{AC2}$ is set to 1 V, and $\Omega_1$ is set to 500 Hz. It is also clear from equation (14) that if the voltage associated with the fixed frequency of $V_{AC1}$ is increased and the rest of the parameters are kept the same, it results in higher amplitude of the combination resonances. FIG. 26 demonstrates this effect from the experimental data obtained for different voltages of $V_{AC1}$. It shows how the amplitude increases from 1.2 mrad to 3.2 mrad, until it is almost equal to the amplitude at the primary natural frequency. Also, an increase in the amplitude of regions between the resonances is also observed. This effectively increases the bandwidth of the resonator using mixed-frequency excitation. In other words, mixed-frequency excitation is proposed according to the embodiments described herein as an effective way to excite resonance sensors to achieve large signal to noise ratios over extended frequency ranges. In this way, narrow or sharp responses over a limited frequency range that negatively affect the performance of devices, such as MEMS gyroscopes, can be avoided.

The results discussed above show that resonances can be activated at various frequencies with a desired amplitude as long the appropriate input voltages are chosen. The ability to generate multiple resonance peaks, control how relatively close those resonance peaks are to each other, and control the amplitude of those resonance peaks without changing the geometry of a MEMS device can be applied in many MEMS applications, such as resonant sensors and other applications.

As indicated above, mixed-frequency excitation can effectively increase the bandwidth of resonators. This occurs when the combination resonances (additive and subtractive) approach the primary natural frequency as the fixed excitation frequency gets small. This results in increasing the bandwidth around the primary resonance.

Figure 27:
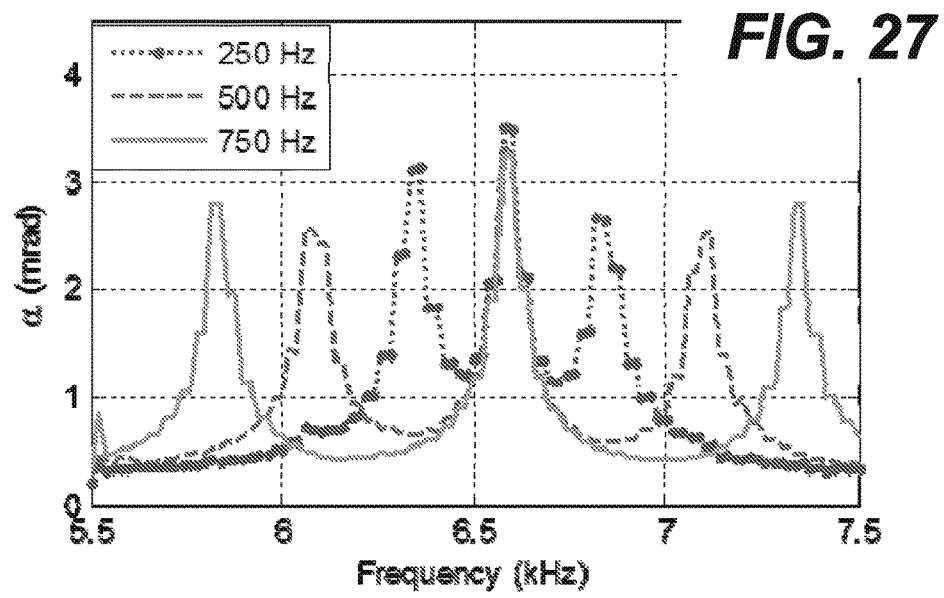
FIG. 27 illustrates a frequency response sweep of the micro mirror in FIGS. 4A-4C under a twelfth set of multi-frequency excitation operating parameters.

FIG. 27 illustrates a frequency response sweep of the micro mirror in FIGS. 4A-4C under a twelfth set of multi-frequency excitation operating parameters. As the twelfth set of operating parameters, $V_{DC}$ is set to 2 V, $V_{AC1}$ is set to 5 V, $V_{AC2}$ is set to 1 V, and $\Omega_1$ is variable. FIG. 27 illustrates experimental results of reducing the fixed frequency of the micro mirror 400 in FIGS. 4A-4C and its effect on bandwidth. In FIG. 27, the bandwidth around the primary natural frequency was increased. Also, a high amplitude of the combination resonances was achieved by selecting the proper voltage input. This indicates that using mixed-frequency excitation can increase the bandwidth in resonators without making any changes to the device design or sacrificing maximum amplitude.

Figure 28:
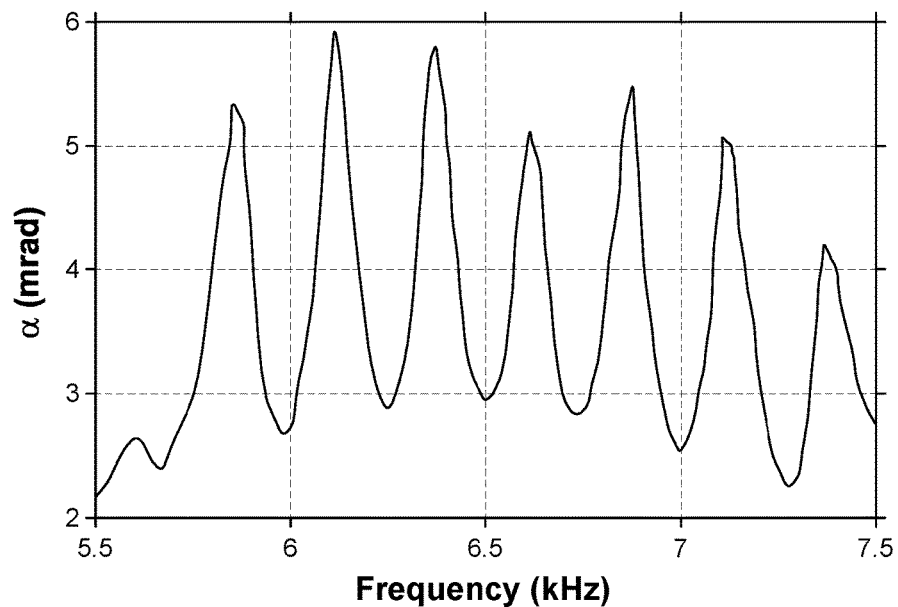
FIG. 28 illustrates a frequency response sweep of the micro mirror in FIGS. 4A-4C under a thirteenth set of multi-frequency excitation operating parameters.

The bandwidth can be further increased if more than two sources of excitation are applied, as each new frequency gives rise to two new resonance peaks around the primary resonance. In this context, FIG. 28 illustrates a frequency response sweep of the micro mirror 400 in FIGS. 4A-4C under a thirteenth set of multi-frequency excitation operating parameters. As the thirteenth set of operating parameters, a frequency response sweep was captured for $\Omega_1$=250 Hz, $\Omega_2$=500 Hz, and $\Omega_3$3=750 Hz. FIG. 28 shows a simulation result of a case where the mirror is excited with three AC frequency sources. It can be observed that there are six resonances surrounding the primary resonance, each associated with the respective fixed frequencies, which in this case are 250 Hz, 500 Hz and 750 Hz.

Figure 29:
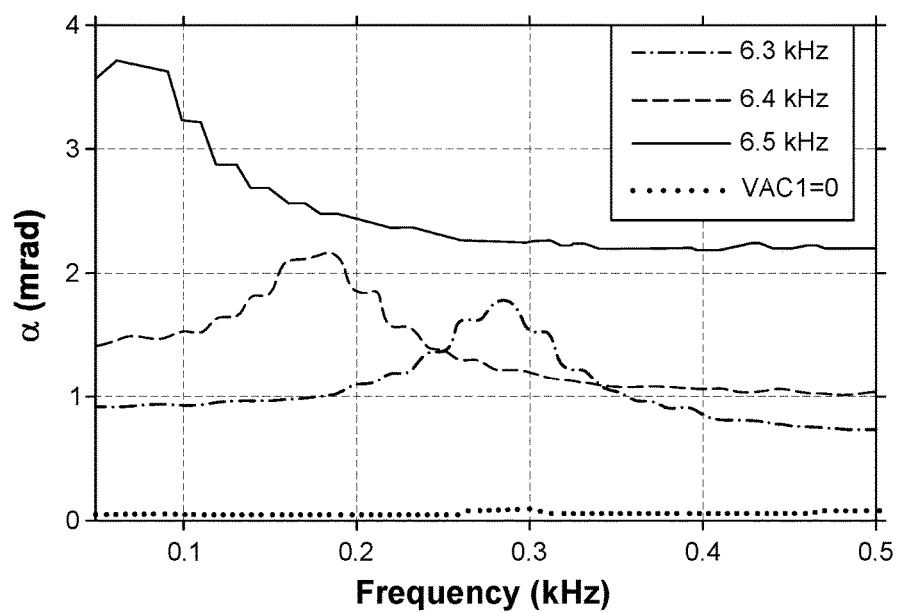
FIG. 29 illustrates the effect of setting the fixed frequency close to the natural frequency in the micro mirror in FIGS. 4A-4C.

For energy harvesters, opposite to the previous case, the magnitude of the fixed frequency is set very close to the primary natural frequency. Then, the subtractive type resonance can be activated at a very small frequency range (close to 0 Hz). FIG. 29 illustrates the effect of setting the fixed frequency close to the natural frequency in the micro mirror 400 in FIGS. 4A-4C. As illustrated in FIG. 29, high amplitude peaks are activated between 100-300 Hz depending upon the fixed frequency. However, no peaks are observed in the case of a single source excitation ($V_{AC1}$=0). Also, the amplitude of the sub resonance is very high and is spread across a wide range of frequencies when the fixed frequency is very close to the natural frequency i.e. 6.4 kHz. This can be promising for energy harvesting, which provides the system with resonances of high amplitudes at very low frequencies regardless of what is the natural frequency of the system. It also allows to target a frequency range for energy harvesters which is otherwise only possible by changing the design and refabricating a new device. This potentially becomes difficult to fabricate as devices for energy harvesting require very low natural frequencies, however mixed frequency excitation can solve this problem. Of course, the energy cost of adding an external source at a fixed frequency to activate the resonance at the other lower frequency from vibration may be investigated before determining the suitability of this method.

Figure 30:
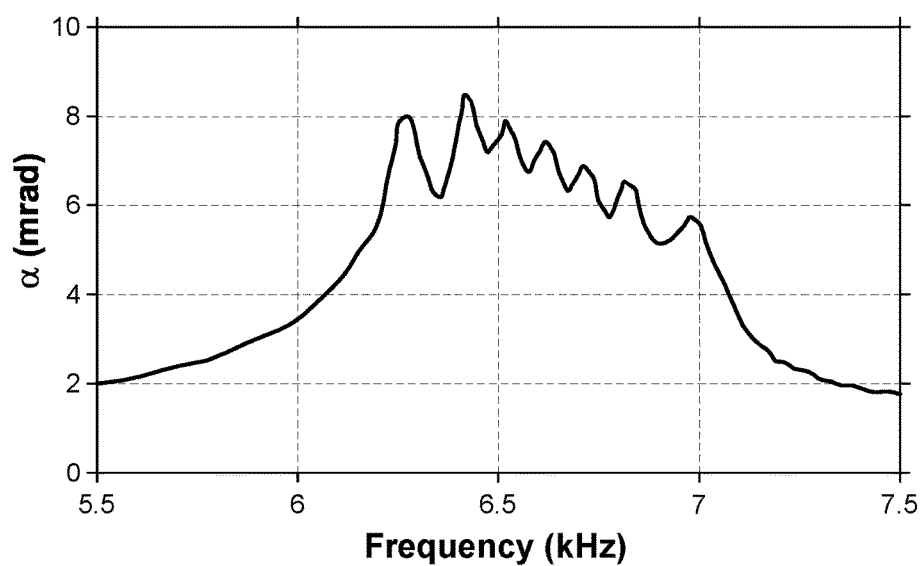
FIG. 30 illustrates an increased bandwidth using the application of more than two sources of excitation.

FIG. 30 illustrates an increased bandwidth using the application of more than two sources of excitation. More particularly, FIG. 30 illustrates a simulated frequency response sweep of a device using four sources of excitation $\Omega_1$–$\Omega_4$, where $\Omega_1$=100 Hz, $\Omega_2$=200 Hz, $\Omega_3$=350 Hz, and $\Omega_4$=variable. As illustrated, the sweep includes a relatively flat peak in response that extends over a bandwidth approaching about 700 kHz. Thus, it should be appreciated that the use of more than two harmonic sources of excitation can be used to further increase the response bandwidth of various devices including but not limited to the micro mirror 400 in FIGS. 4A-4C. In other words, an operating bandwidth of the micro mirror 400 can be increased by applying at least one other source of excitation to the micro mirror 400.

Multi and mixed-frequency excitation has been studied both theoretically and experimentally based on a Polymide micro-mirror. The mixed frequency excitation can be effectively used in resonators and resonant sensors to increase their bandwidths by pushing the combination resonances close to their primary natural frequencies and by maintaining the overall amplitude in the vicinity of the primary natural frequency. Furthermore, it is possible to implement this scheme for energy harvesters to force the combination resonances to a small range of a few hundred Hz and maintain high amplitude at that range. This is enabled due to the control over the amplitude and frequencies of the combination resonances provided by mixed-frequency excitation.

Thus, multi-frequency excitation can be used to measure the natural frequencies of MEMS and NEMS devices of relatively high operating frequencies and stiff structures. Some MEMS optical measurement devices have a small range, and the techniques described herein can be used to measure the natural frequencies of stiff MEMS and NEMS devices by applying large exciting frequencies close to the predicated resonance frequencies of the devices.

We investigated analytically and experimentally the nonlinear dynamics of an electrically actuated clamped-clamped microbeam under our two-source harmonic excitation and also for higher-order modes of vibrations. One frequency source was swept around the first three modes of vibration while the other frequency source was fixed. The microbeam was fabricated using polyimide as a structural layer coated with nickel from top and chromium and gold layers from bottom. Using the Galerkin method, a reduced order model was derived to simulate the static and dynamic response of the device. A good agreement between the theoretical and experimental data was found. Using partial electrodes and multi-frequency electrical source, we discovered a large bandwidth large amplitude resonator excited near the higher order modes of vibration. The excitation of additive and subtractive type resonances is highlighted. It shows that by properly tuning the frequency and amplitude of the excitation force, the frequency bandwidth of the resonator can be controlled.

Figure 31:
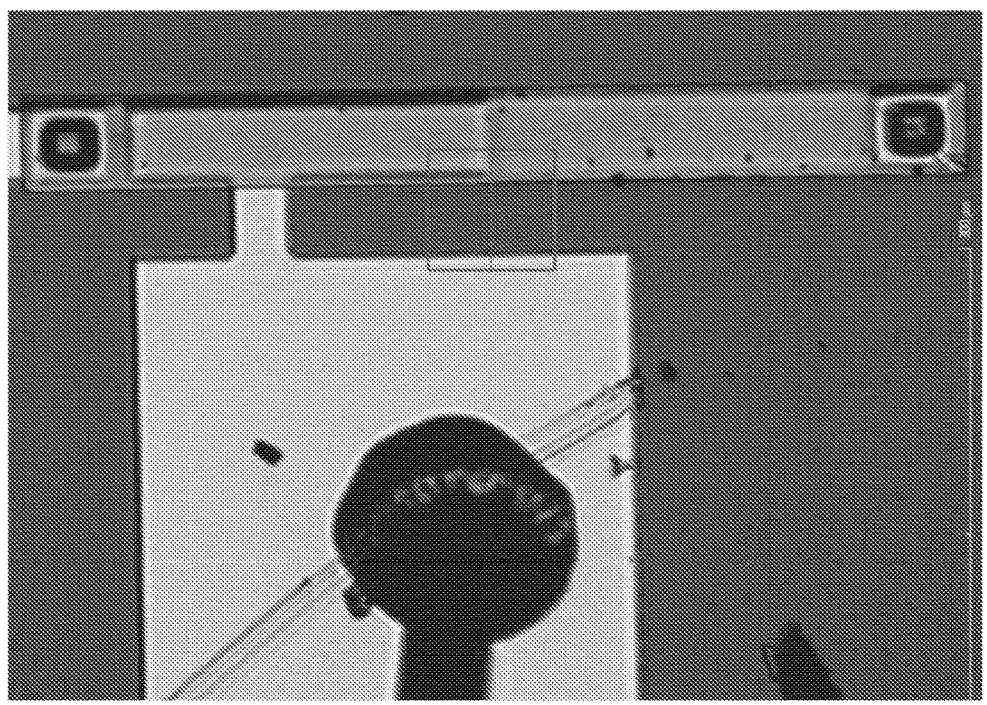
FIG. 31 depicts a top view picture of a fabricated microbeam with half lower electrode configuration and the actuation pad.

In our investigation, we fabricated and characterized a 400 μm long microbeam with half lower electrode configuration, as depicted in FIG. 31. The half electrode excites the anti-symmetric and symmetric mode of vibration.

Fabrication

Figure 32:
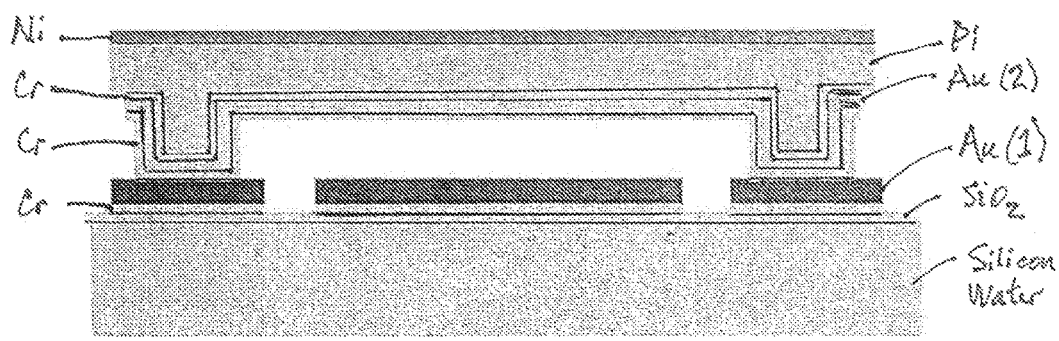
FIG. 32 depicts a cross-sectional view of the fabricated microbeam of FIG. 31

The clamped-clamped microbeam resonator was fabricated using the in-house process developed in [29], [30]. The microbeam consists of a 6 μm polyimide structural layer coated with a nickel layer from top and 50 nm chrome, 250 nm gold and 50 nm chrome from bottom. The lower electrode is placed directly underneath the microbeam and is composed of gold and chrome layers. The lower electrode provides the electrical actuation force to the resonator. The two electrodes are separated by a 2 μm air gap. When the two electrodes connected to an external excitation voltage, the resonator vibrates in the out-of-plane direction. FIG. 32 shows a picture illustrating the various layers of the fabricated resonator.

Figure 33:
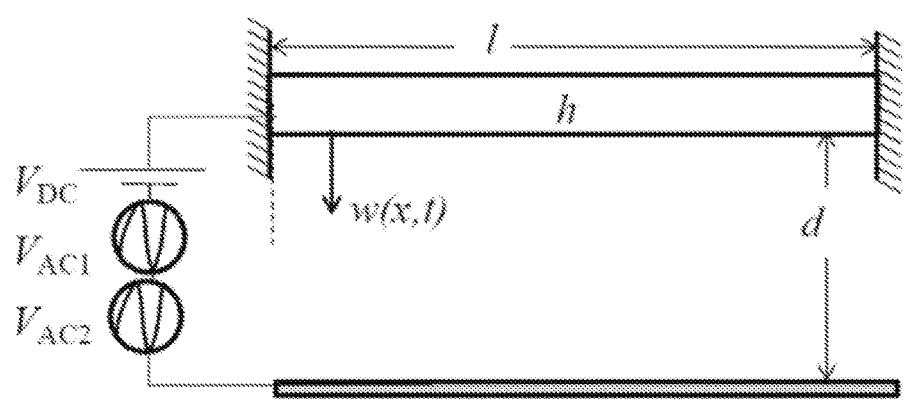
FIG. 33 depicts a schematic of a fabricated resonator.

We now consider the governing equation for a clamped-clamped microbeam, which is electrostatically actuated by two AC harmonic loads $V_{AC1}$ and $V_{AC2}$ of frequencies $\Omega_1$ and $\Omega_2$, respectively, superimposed to a DC load $V_{DC}$, FIG. 33. The equation of motion governing the dynamics of the microbeam can be written as $$EI\frac{\partial^4 w}{\partial x^4} + \rho A \frac{\partial^2 w}{\partial t^2} + c\frac{\partial w}{\partial t} = \frac{\partial^2 w}{\partial x^2}\left[N + \frac{EA}{2l}\int_0^l \left(\frac{\partial w}{\partial x}\right)^2 dx\right] + \frac{\varepsilon b[V_{DC} + V_{AC1}\cos(\Omega_1 t) + V_{AC2}\cos(\Omega_2 t)]^2}{2(d-w)^2} \quad (17)$$

where E is the modulus of elasticity, I is the microbeam moment of inertia, C is the damping coefficient, A is the cross sectional area, ρ is the density, ε is the air permittivity, d is the air gap thickness, t is the time, x is the position along the beam, N is the axial force, and is the microbeam deflection. The boundary conditions of the clamped-clamped microbeam are:

$$w(0,t) = 0 \quad \frac{\partial w}{\partial x}(0,t) = 0 \quad (18)$$
$$w(l,t) = 0 \quad \frac{\partial w}{\partial x}(l,t) = 0$$

Normalization has many advantages that simplify the analysis and numerical computations such as rescaling all the quantities into the same order of magnitude and analyzing the system behavior regardless of the units. Accordingly, the following nondimensional variables (denoted by hats) are introduced:

$$\hat{w} = \frac{w}{d},$$
$$\hat{x} = \frac{x}{l},$$
$$\hat{t} = \frac{t}{T}$$

where T is a time scale defined as $$T = \sqrt{\frac{\rho b h l^4}{EI}} \quad (19)$$

Substituting Eq. (19) into Eqs. (17) and (18) and dropping the hats from the nondimensional variables for convenience, the following nondimensional equation is derived:

$$\frac{\partial^4 w}{\partial x^4} + \frac{\partial^2 w}{\partial x^2} + c_{non}\frac{\partial w}{\partial t} = \frac{\partial^2 w}{\partial x^2}\left[N_{non} + \alpha_1 \int_0^l \left(\frac{\partial w}{\partial x}\right)^2 dx\right] + \frac{\alpha_2[V_{DC} + V_{AC1}\cos(\Omega_1 t) + V_{AC2}\cos(\Omega_2 t)]^2}{(1-w)^2} \quad (20)$$

and the normalized boundary conditions are $$w(0,t) = 0 \quad \frac{\partial w}{\partial x}(0,t) = 0 \quad (21)$$
$$w(l,t) = 0 \quad \frac{\partial w}{\partial x}(l,t) = 0$$

where the parameters in Eq. (20) are defined as $$c_{non} = \frac{12cl^4}{ETbh^3}; \quad (22)$$
$$\alpha_1 = 6\left(\frac{d}{h}\right)^2;$$
$$\alpha_2 = \frac{6\varepsilon l^4}{Eh^3 d^3};$$
$$N_{non} = \frac{12Nl^2}{Ebh^3}$$

To calculate the beam response, we solve the normalized microbeam equation, Eq. (20), in conjunction with its boundary conditions, Eq. (21), using the Galerkin method [12]. This method reduces the partial differential equation into a set of coupled second order differential equations. The microbeam deflection is approximated as $$w(x,t) = \sum_{i=1}^{n} \phi_i(x) u_i(t) \quad (23)$$

where $\phi_i(x)$ is chosen to be the $i^{th}$ undamped unforced linear orthonormal clamped-clamped beam modeshape, $u_i(t)$ is the $i^{th}$ modal coordinate, and n is the number of assumed modes. To find the modeshape functions $\phi(x)$, we solve the eigenvalue problem $$\phi^{(4)}(x) - N_{non}\phi^{(2)}(x) - \omega_{non}^2 \phi(x) = 0 \quad (24)$$

where $\omega_{non}$ is the eigen frequency. Both sides of Eq. (20) are multiplied by $(1-w)^2$ to simplify the spatial integration of the forcing term [12]. Then, we substitute Eq. (23) into Eq. (20) and multiply the outcome by the modeshape $\phi_j(x)$. Next, we integrate the resulted equation from 0-1 over the spatial domain as below $$\int_0^1 \phi_j \left(1 - \sum_{l=1}^{n} u_l \phi_l\right)^2 \left(\sum_{i=1}^{n} u_i \omega_{nom,i}^2 \phi_i + \sum_{i=1}^{n} \ddot{u}_i \phi_i\right) dx + \quad (25)$$
$$c_{non} \int_0^1 \phi_j \left(1 - \sum_{l=1}^{n} u_l \phi_l\right)^2 \left(\sum_{i=1}^{n} \dot{u}_i \phi_i\right) dx - $$
$$\alpha_1 \int_0^1 \phi_j \left(1 - \sum_{l=1}^{n} u_l \phi_l\right)^2 \left\{\sum_{i=1}^{n} u_i \phi_i'' \int_0^1 \left(\sum_{k=1}^{n} u_k \phi_k'\right)^2\right\} dx = $$
$$\alpha_2 [V_{DC} + V_{AC1}\cos(\Omega_1 t) + V_{AC2}\cos(\Omega_2 t)]^2 \int_0^1 \phi_j dx$$

Evaluating the spatial integration in Eq. (25) produces a set of coupled ordinary equation, which can be solved numerically using the Runge-Kutta method. We implement the first three modeshapes to produce converged and accurate simulation results.

Characterization

Figure 34:
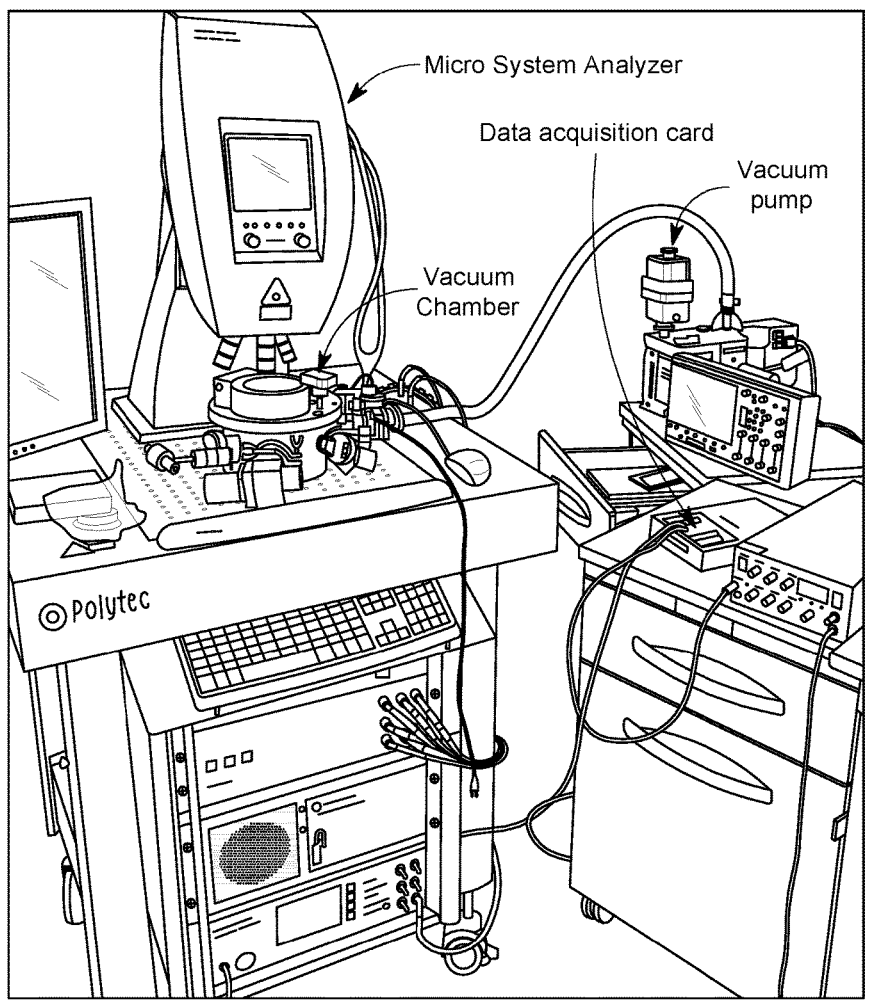
FIG. 34 depicts an experimental setup used for testing the MEMS devices.

We now describe the experimental characterization setup used for testing the device and measuring the initial profile, gap thickness, and the out-of-plane vibration. The experiment was conducted on the 400 μm with lower electrode that spans half of the beam length. This electrode provides anti-symmetric electrical force to excite the symmetric and anti-symmetric resonance frequencies. The experimental setup, FIG. 34, consists of a micro system analyzer (MSA), which is a high frequency laser-Doppler vibrometer, under which the microbeam is placed to measure the vibration, data acquisition card, an amplifier to provide actuation signals of wide range of frequencies and amplitudes, and a vacuum chamber equipped with ports to pass the actuation signal and measure the pressure. Also, the chamber is connected to a vacuum pump that reduces the pressure as low as 4 mTorr.

A. Topography Characterization

Figure 35:
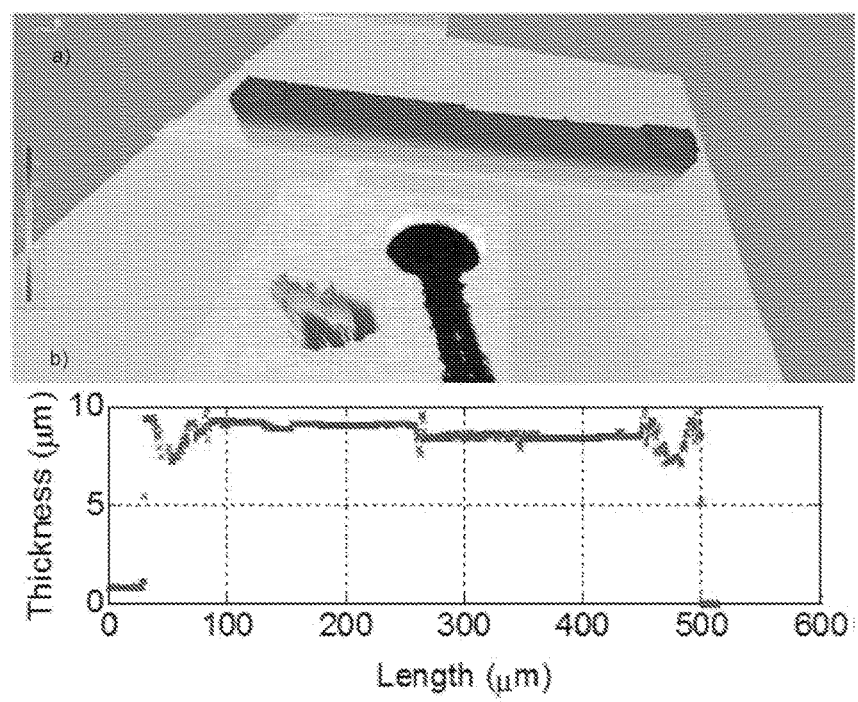
FIG. 35 illustrates the topography of a 400 μm long microbeam including: A) a 3D map of the microbeam profile; and B) a cross-sectional view of the microbeam profile.

The initial profile of the microbeam is revealed using an optical profilometer. After defining the vertical scanning range and exposure time, a 3D map of the microbeam is generated, FIG. 35. The combined thickness of the microbeam and air gap is measured around 9 μm, which is slightly smaller from the design nominal value of 9.35 μm. Also, the microbeam total length is 400 μm with a fully straight profile without any curvature or curling.

B. Static Characterization

To characterize the static behavior of the device we initially biased the microbeam by a slow DC ramp voltage, generated using the data acquisition card, and measured the static deflection. The experimental result is reported in FIG. 36. The deflection increases until it exhibits pull in at 168 V.

C. Natural Frequencies

Figure 37:
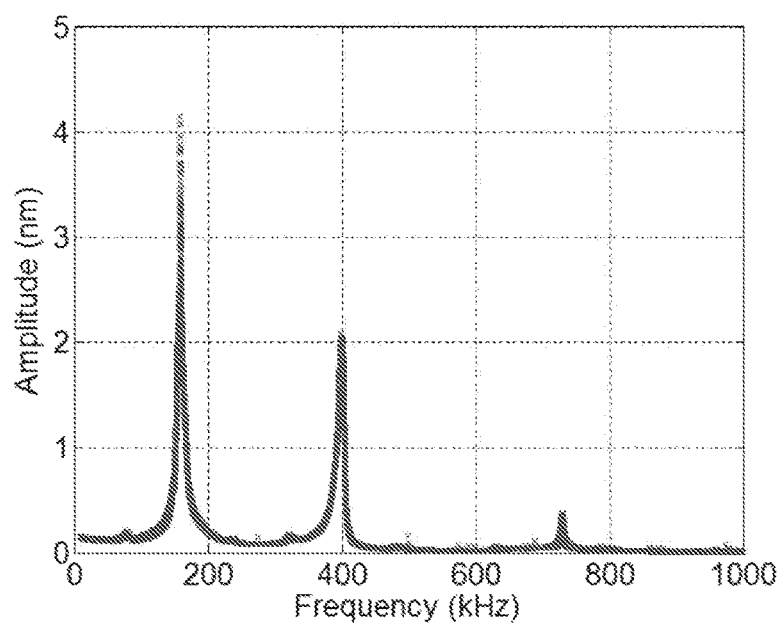
FIG. 37 depicts a frequency response curve of the microbeam to white noise actuation signal at a load of $V_{DC}$=30V and $V_{AC}$=50V and a pressure of 4 mTorr.
Figure 38:
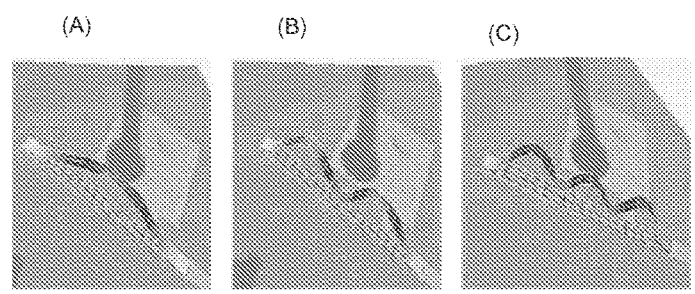
FIGS. 38(A)-(C) depict the vibrational mode shapes (RMS absolute values) of the microbeam. (A) is a first mode at $\omega_1$=160 kHz; (B) is a second mode at $\omega_2$=402 kHz; and (C) is a third mode at $\omega_3$=738 kHz.

We experimentally measured the first three natural frequencies by exciting the device by white noise signal of $V_{DC}=30V$ and $V_{AC}=50V$. The vibration at different points along the beam length is scanned to extract the vibration mode shapes and resonance frequencies. The acquired frequency response curve is shown in FIG. 37, which reveals the values of the first three natural frequencies $\omega_1=160$ kHz, $\omega_2=402$ kHz, and $\omega_3=738$ kHz. The acquired modeshapes (RMS absolute values) are reported in FIGS. 38(A)-(C). We notice at $\omega_1$ FIG. 38(A) all points are vibrating whereas at $\omega_2$ FIG. 38(B) the mid points are nodal points. Also, at $\omega_3$ FIG. 38(C) there are two nodal points. These results match the clamped-clamped structure first, second and third vibration modeshapes.

Frequency Response Curves

We experimentally investigated the nonlinear response of the microbeam near the first three modes of vibration. The microbeam was excited using the data acquisition card and the vibration is detected using the laser Doppler vibrometer. The excitation signal is composed of two AC signals $V_{AC1}$ and $V_{AC2}$ superimposed to a DC signal $V_{DC}$. The measurement is performed by focusing the laser at the mid-point for the first and third mode measurements and at quarter of the beam length for the second mode measurement. Then, the frequency response curve is generated by taking the steady state maximum amplitude of the motion $W_{max}$.

Figure 39:
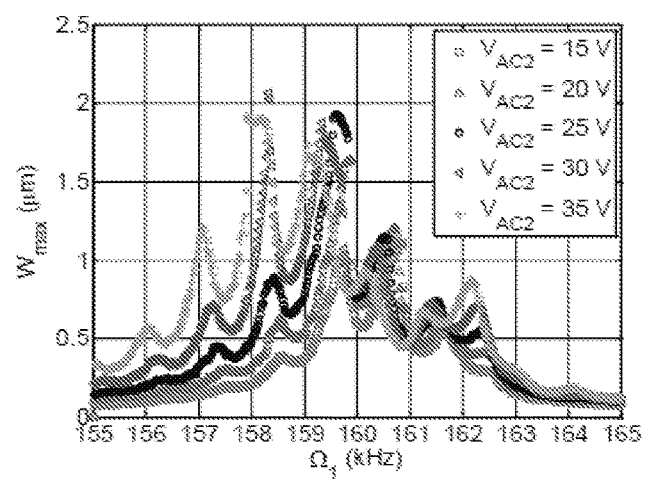
FIG. 39 illustrates a frequency response curve for $V_{DC}$=15V, $V_{AC1}$=5V and $\Omega_2$=1 kHz near the first mode.
Figure 40:
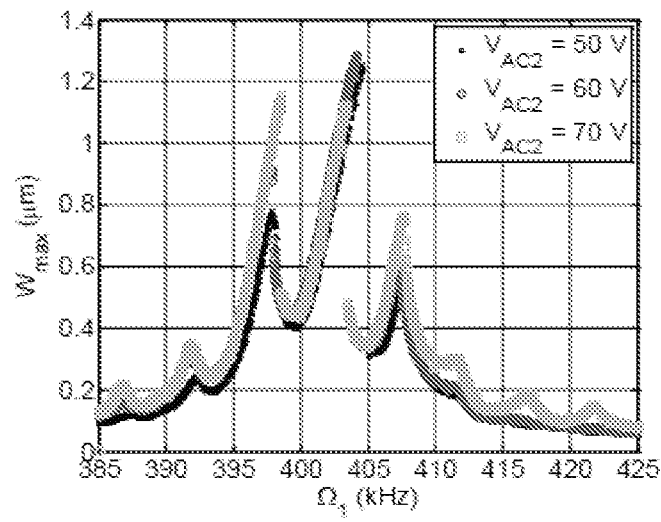
FIG. 40 illustrates a frequency response curve for $V_{DC}$=15V, $V_{AC1}$=20V and $\Omega_2$=5 kHz near the second mode.
Figure 41:
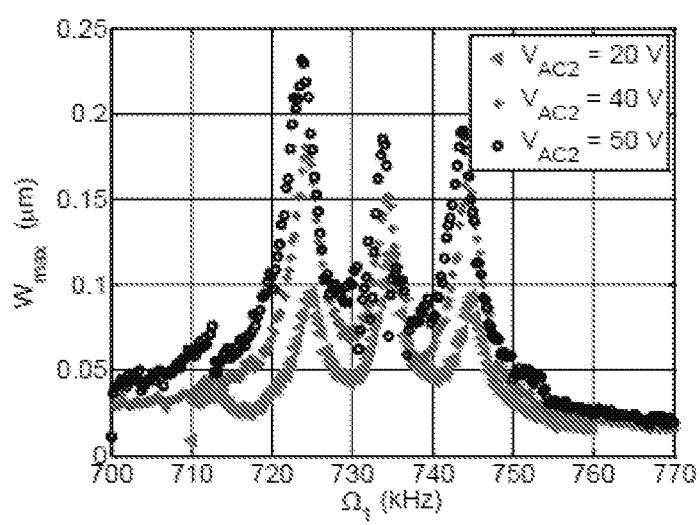
FIG. 41 illustrates a frequency response curve for $V_{DC}$=20V, $V_{AC1}$=40V and $\Omega_2$=10 kHz near the third mode.

Next, we demonstrate broadening of the high-amplitude response near resonance through multi-frequency excitation. The generated frequency response curves near the first mode are depicted in FIG. 39. Each curve shows the frequency response for different values of $V_{AC2}$. The results are obtained by sweeping the frequency of the first AC source $\Omega_1$ around the first mode and fixing the second source frequency $\Omega_2$ at 1 kHz. The swept source voltage $V_{AC1}$ and the DC voltage are fixed at 5V and 15V, respectively. FIG. 39 demonstrates clearly the enlargement of the response around the primary resonance. FIG. 40 shows the result of sweeping the first source frequency $\Omega_1$ around the second mode while fixing the second source frequency $\Omega_2$ at 5 kHz. The swept source voltage $V_{AC1}$ and the DC voltage are fixed at 20 V and 15 V, respectively. Also, this experiment was repeated near the third mode as shown in FIG. 41 where $\Omega_2$ is fixed at 10 kHz and the actuation voltages $V_{AC1}$ and the DC are fixed at 40 V and 20 V, respectively. The chamber pressure is fixed at 4 mTorr.

The curves of FIGS. 39-41 highlight the effect of $V_{AC2}$ on the combination resonances where new resonance peaks appear at frequencies of additive type at 1 $(\Omega_1+\Omega_2)$, $(\Omega_1+2\Omega_2)$, $(\Omega_1+3\Omega_2)$ and subtractive type at $(\Omega_1-\Omega_2)$, $(\Omega_1-2\Omega_2)$ $(\Omega_1-3\Omega_2)$ [32]. These resonances arise due to the quadratic nonlinearity of the electrostatic force and the cubic nonlinearity due to mid-plane stretching. Also, a hardening behavior is reported near the first, second, and third resonances. As $V_{AC2}$ increases near the first resonance in FIG. 39, the response curves tilt towards the lower frequency values (softening) where the quadratic nonlinearity from the electrostatic force dominates the cubic nonlinearity from mid-plane stretching.

Figure 42:
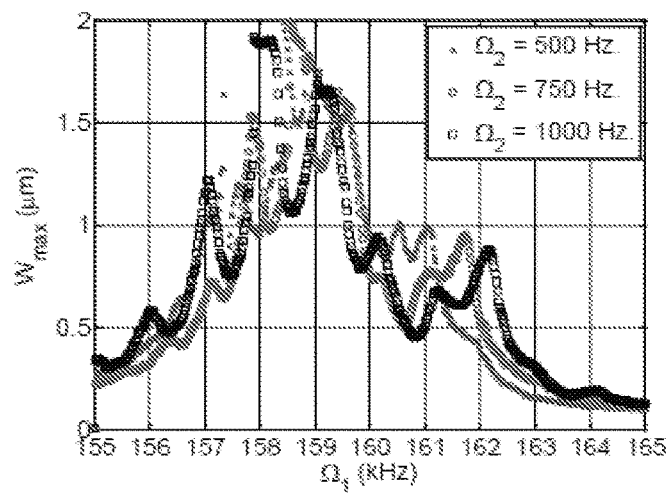
FIG. 42 illustrates a frequency response curve for different values for $\Omega_1$ at $V_{DC}$=15V, $V_{AC1}$=5V, $V_{AC2}$=35V near the first mode.
Figure 43:
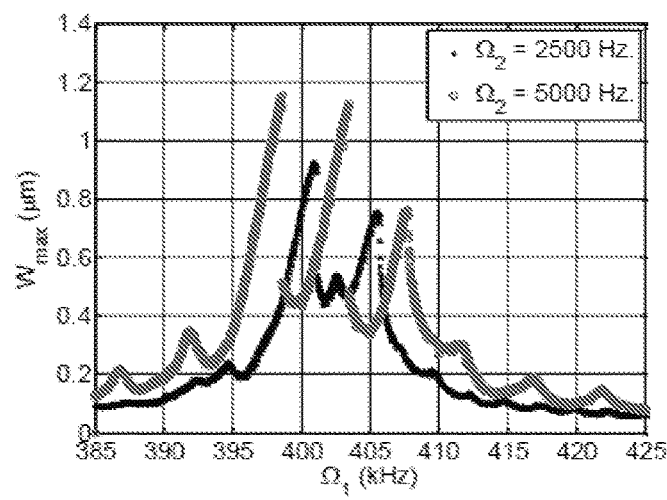
FIG. 43 illustrates a frequency response curve for different values of $\Omega_2$ at $V_{AC1}$=20V, $V_{AC2}$=70V near the second mode.
Figure 44:
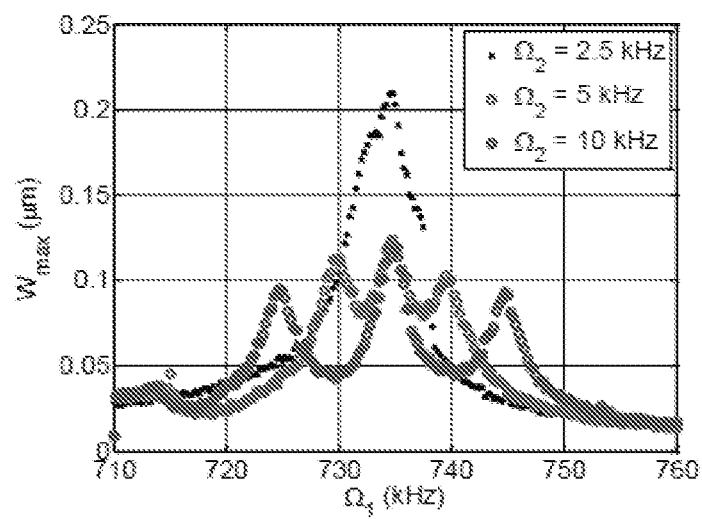
FIG. 44 illustrates a frequency response curve for different values of $\Omega_2$ at $V_{DC}$=20V, $V_{AC1}$=40V, $V_{AC2}$=20V near the third mode.

FIG. 42, FIG. 43, and FIG. 44 show the results for different values of $\Omega_2$ under the same electrodynamic loading condition near the first, second, and third resonance frequencies, respectively. As $\Omega_2$ decreases further, a continuous band of high amplitude is formed. This demonstrates that multi-frequency excitation can be used to broaden the large amplitude response around the main resonance, and hence increases the bandwidth, even for higher-order modes.

The previous results demonstrated the broadening and widening of the frequency band of large amplitude near resonance, which can have several practical applications. Typically resonators of resonant sensors may not be driven necessary at the exact sharp peak due to noise, temperature fluctuation, and other uncertainty, which result in significant losses and weak signal to noise ratio. The above results prove the ability to control the resonator bandwidth by properly tuning the excitation force frequencies. Also, by using the partial lower electrode configuration and properly tuning the excitation voltages the higher order modes of vibration are excited with high amplitudes above the noise level.

Simulation Results

The microbeam dynamical behavior is modeled according to Eq. (20) with the unknown EI, N and c, which are extracted experimentally. All the results are obtained based on the derived reduced order model.

A. Parameters Extraction

Figure 45:
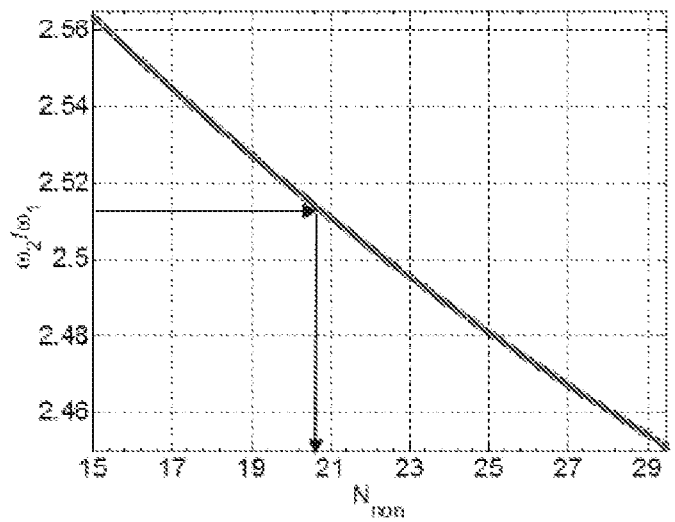
FIG. 45 illustrates the ratio of the first to second eigen frequencies for different values of the nondimensional axial force $N_{non}$.

The eigenvalue problem of Eq. (24) is solved for different values of the non-dimensional internal axial force $N_{non}$ to find the theoretical frequency ratio $\omega_2/\omega_1$ of FIG. 37 that matches the measured ratio. One should note here that because the DC bias in FIG. 37 is small, its softening effect (its impact on the eigenvalue problem), can be considered negligible. As illustrated in FIG. 45, for $N_{non}$=20.82 theoretical and experimental ratios are matched.

Figure 36:
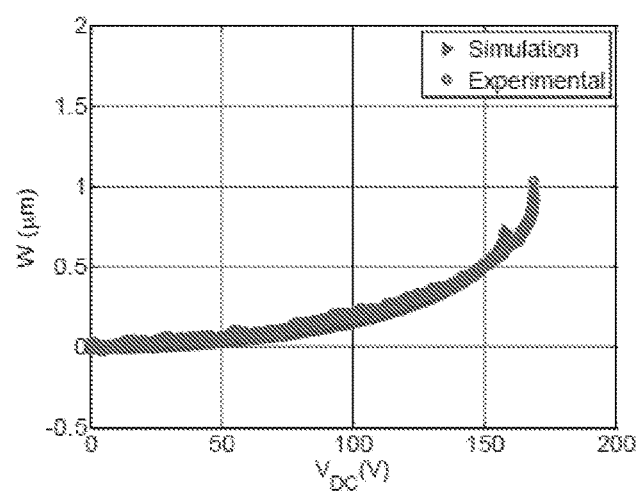
FIG. 36 illustrates the static deflection of the 400 μm length microbeam with half electrode configuration.
Figure 46:
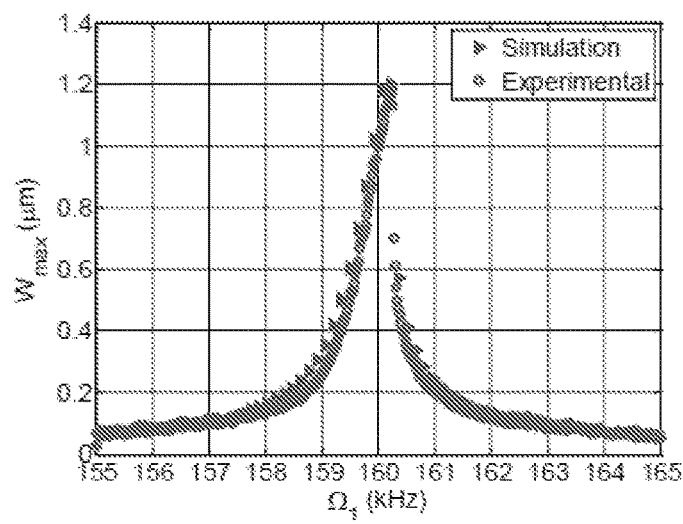
FIG. 46 illustrates a frequency response curve near the first vibrational mode at $V_{DC}$=25V and $V_{AC}$=5V.

To extract the flexural rigidity EI, we utilize the static deflection curve and match the theoretical result with the experimental data of FIG. 36. Based on the static solution of Eq. (20), we found that EI=10.6×10$^{-9}$ N·m$^2$. The damping ratio $\zeta$ is extracted from the frequency response curve of the beam to a single and small AC excitation where the experimental and theoretical results are matched at $\zeta$=0.002 The result is reported in FIG. 46.

Figure 47:
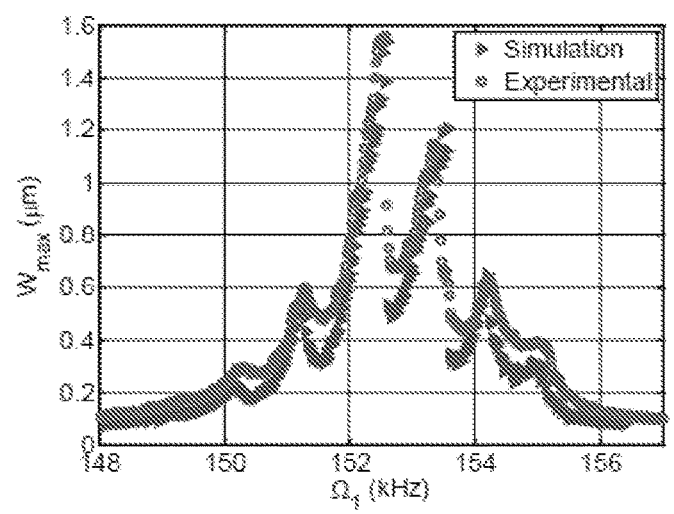
FIG. 47 illustrates experimental and simulation results of the microbeam near the first mode of vibration for $V_{DC}$=15V, $V_{AC1}$=5V, $V_{AC2}$=20V and $\Omega_2$=1 kHz.
Figure 48:
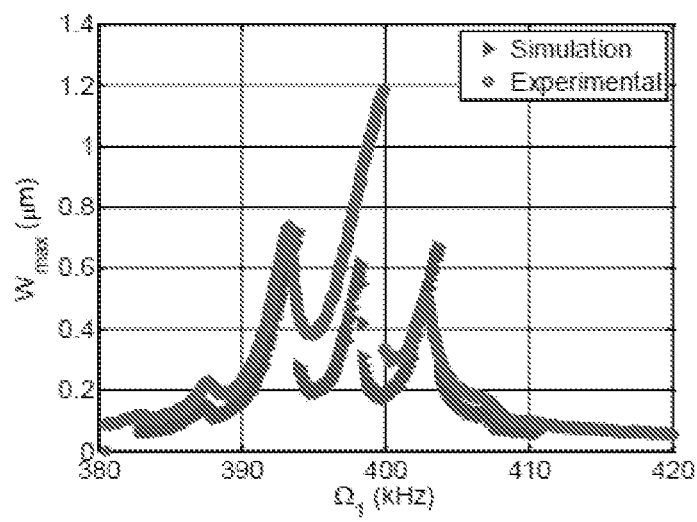
FIG. 48 illustrates experimental and simulation results of the microbeam near the second mode of vibration for $V_{DC}$=20V, $V_{AC1}$=15V, $V_{AC2}$=50V and $\Omega_2$=5 kHz.
Figure 49:
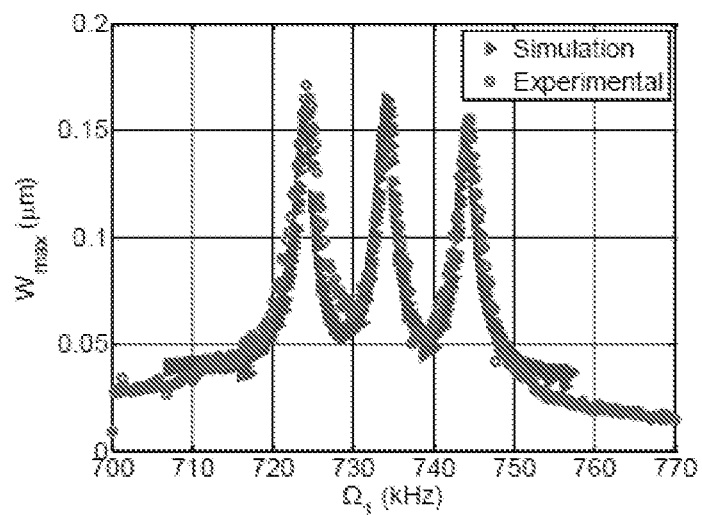
FIG. 49 illustrates experimental and simulation results of the microbeam near the third mode of vibration for $V_{DC}$=20V, $V_{AC1}$=40V, $V_{AC2}$=40V and $\Omega_2$=10 kHz.

The simulated dynamic response is based on long time integration of the modal equations of the reduced-order model of Eq. (25) until steady state response is reached. The first three mode shapes are used in the reduced-order model to approximate the response. The simulation and experimental results for the multi-frequency excitation near the first three modes of vibrations are reported in FIGS. 47-49. Using the Galerkin approximation, the model predicts the resonator response accurately near the first and third mode shape. Near the second mode, long time integration failed to capture the complete solution due to the weak basin of attraction near the large response curve, as shown in FIG. 48. As reported in [31], long time integration depends on how large and robust is the basin of attraction to capture a solution. Another numerical techniques need to be implemented to predict the complete response accurately. In [31], shooting technique is used to find the entire response and capture the stable and unstable periodic solutions.

CONCLUSIONS

Thus, we investigated the dynamics of an electrically actuated clamped-clamped microbeam excited by two harmonic AC sources with different frequencies superimposed to a DC voltage near the first three modes of vibrations. After recording the static deflection curve and detecting the first three natural frequencies, numerical analysis was conducted to extract the device parameters. Then, the governing equation was solved using three mode shapes, which provides a good agreement between the simulation and the experimental result. Moreover, we proved the ability to excite the combination resonance of additive and subtractive type. In addition, the ability to broaden and control the bandwidth of the resonator near the higher order modes has been shown by properly tuning the frequency of the fixed source. Also, increasing the fixed frequency source voltage and using partial electrode configuration, the vibration amplitude with respect to noise near the higher order modes is enhanced. These capabilities of generating multiple peaks and a wide continuous response band with ability to control its amplitude and location can have an application in increasing the resonator band width for applications, such mechanical logic circuits, energy harvesting, and mass sensing.

Although embodiments have been described herein in detail, the descriptions are by way of example. The features of the embodiments described herein are representative and, in alternative embodiments, certain features and elements may be added or omitted. Additionally, modifications to aspects of the embodiments described herein may be made by those skilled in the art without departing from the spirit and scope of the present invention defined in the following claims, the scope of which are to be accorded the broadest interpretation so as to encompass modifications and equivalent structures.

REFERENCES

[1] S. Subhashini and A. Vimala Juliet, "Toxic gas sensor using resonant frequency variation in micro-cantilever," in Sustainable Utilization and Development in Engineering and Technology (STUDENT), 2012 IEEE Conference on, 2012, pp. 87-91.
[2] S. Dohn, R. Sandberg, W. Svendsen, and A. Boisen, "Enhanced functionality of cantilever based mass sensors using higher modes," Applied Physics Letters, vol. 86, pp. 233501, 2005.
[3] E. Gil-Santos, D. Ramos, J. Martinez, M. Fernández-Regúlez, R. Garcia, Á. San Paulo, et al., "Nanomechanical mass sensing and stiffness spectrometry based on two-dimensional vibrations of resonant nanowires," Nature nanotechnology, vol. 5, pp. 641-645, 2010.
[4] M. Hanay, S. Kelber, A. Naik, D. Chi, S. Hentz, E. Bullard, et al., "Single-protein nanomechanical mass spectrometry in real time," Nature nanotechnology, vol. 7, pp. 602-608, 2012.
[5] T. P. Burg, A. R. Mirza, N. Milovic, C. H. Tsau, G. A. Popescu, J. S. Foster, et al., "Vacuum-packaged suspended microchannel resonant mass sensor for biomolecular detection," Microelectromechanical Systems, Journal of, vol. 15, pp. 1466-1476, 2006.
[6] W. T. Hsu, J. R. Clark, and C. T.-C. Nguyen, "A resonant temperature sensor based on electrical spring softening," in Tech. Dig., 11th Int. Conf. on Solid-State Sensors Actuators (Transducers' 01), Munich, Germany, 2001, pp. 1484-1487.
[7] H. C. Kim, S. Seok, I. Kim, S.-D. Choi, and K. Chun, "Inertial-grade out-of-plane and in-plane differential resonant silicon accelerometers (DRXLs)," in Solid-State Sensors, Actuators and Microsystems, 2005. Digest of Technical Papers. TRANSDUCERS'05. The 13th International Conference on, 2005, pp. 172-175.
[8] A. H. Ramini, M. I. Younis, and Q. Sue, "A low-g electrostatically actuated resonant switch," Smart Materials and Structures, Vol. 22, 0964-1726, January, 2013.
[9] B. Piekarski, M. Dubey, D. Devoe, E. Zakar, R. Zeto, J. Conrad, et al., "Fabrication of suspended piezoelectric microresonators," Integrated Ferroelectrics, vol. 24, pp. 147-154, 1999.
[10] D. Jin, X. Li, J. Liu, G. Zuo, Y. Wang, M. Liu, et al., "High-mode resonant piezoresistive cantilever sensors for tens-femtogram resoluble mass sensing in air," Journal of Micromechanics and Microengineering, vol. 16, pp. 1017, 2006.
[11] G. Rinaldi, M. Packirisamy, and I. Stiharu, "Quantitative boundary support characterization for cantilever MEMS," Sensors, vol. 7, pp. 2062-2079, 2007.
[12] M. I. Younis, MEMS Linear and Nonlinear Statics and Dynamics: Mems Linear and Nonlinear Statics and Dynamics vol. 20: Springer Science & Business Media, 2011.
[13] J. F. Rhoads, S. W. Shaw, and K. L. Turner, "Nonlinear dynamics and its applications in micro- and nanoresonators," Journal of Dynamic Systems, Measurement, and Control, vol. 132, pp. 034001, 2010.
[14] R. Kalyanaraman, G. Rinaldi, M. Packirisamy, and R. Bhat, "Equivalent area nonlinear static and dynamic analysis of electrostatically actuated microstructures," Microsystem technologies, vol. 19, pp. 61-70, 2013.
[15] F. M. Alsaleem, M. I. Younis, and H. M. Ouakad, "On the non-linear resonances and dynamic pull-in of electrostatically actuated resonators," Journal of Micromechanics and Microengineering, vol. 19, pp. 045013, 2009.
[16] J. F. Rhoads, V. Kumar, S. W. Shaw, and K. L. Turner, "The non-linear dynamics of electromagnetically actuated microbeam resonators with purely parametric excitations," International Journal of Non-Linear Mechanics, vol. 55, pp. 79-89, 2013.
[17] M. Younis and A. Nayfeh, "A study of the nonlinear response of a resonant microbeam to an electric actuation," Nonlinear Dynamics, vol. 31, pp. 91-117, 2003.
[18] M. Younis, "Multi-mode excitation of a clamped-clamped microbeam resonator," Nonlinear Dynamics, vol. 80, pp. 1531-1541, May 1, 2015.
[19] A. H. Nayfeh and M. I. Younis, "Dynamics of MEMS resonators under superharmonic and subharmonic excitations," Journal of Micromechanics and Microengineering, vol. 15, pp. 1840, 2005.
[20] M. Bagheri, M. Poot, M. Li, W. P. Pernice, and H. X. Tang, "Dynamic manipulation of nanomechanical resonators in the high-amplitude regime and non-volatile mechanical memory operation," Nature nanotechnology, vol. 6, pp. 726-732, 2011.
[21] S. Ilyas, A. Ramini, A. Arevalo, and M. I. Younis, "An Experimental and Theoretical Investigation of a Micromirror Under Mixed-Frequency Excitation." (DOI: 10.1109/JMEMS.2014.2386285).
[22] V. R. Challa, M. Prasad, Y. Shi, and F. T. Fisher, "A vibration energy harvesting device with bidirectional resonance frequency tunability," Smart Materials and Structures, vol. 17, pp. 015035, 2008.
[23] R. Harne and K. Wang, "A review of the recent research on vibration energy harvesting via bistable systems," Smart Materials and Structures, vol. 22, pp. 023001, 2013.
[24] H. Cho, M.-F. Yu, A. F. Vakakis, L. A. Bergman, and D. M. McFarland, "Tunable, broadband nonlinear nanomechanical resonator," Nano letters, vol. 10, pp. 1793-1798, 2010.
[25] B. Gallacher, J. Burdess, and K. Harish, "A control scheme for a MEMS electrostatic resonant gyroscope excited using combined parametric excitation and harmonic forcing," Journal of Micromechanics and Microengineering, vol. 16, pp. 320, 2006.
[26] H. Liu, Y. Qian, and C. Lee, "A multi-frequency vibration-based MEMS electromagnetic energy harvesting device," Sensors and Actuators A: Physical, vol. 204, pp. 37-43, 2013.
[27] I. Mahboob, E. Flurin, K. Nishiguchi, A. Fujiwara, and H. Yamaguchi, "Interconnect-free parallel logic circuits in a single mechanical resonator," Nature communications, vol. 2, pp. 198, 2011.
[28] D. Forchheimer, D. Platz, E. A. Tholén, and D. B. Haviland, "Model-based extraction of material properties in multifrequency atomic force microscopy," Physical Review B, vol. 85, pp. 195449, 2012.

[29] L. Mamat, A. A. Carreno, D. Conchouso, M. G. Martinez, I. G. Foulds, and A. Shamim, "New Movable Plate for Efficient Millimeter Wave Vertical on-Chip Antenna," IEEE Transactions on Antennas and Propagation, vol. 61, pp. 1608-1615, 2013.

[30] A. Alfadhel, A. A. Arevalo Carreno, I. G. Foulds, and J. Kosel, "Three-Axis Magnetic Field Induction Sensor Realized on Buckled Cantilever Plate," Magnetics, IEEE Transactions on, vol. 49, pp. 4144-4147, 2013.

[31] A. M. Bataineh, and M. I. Younis. "Dynamics of a clamped-clamped microbeam resonator considering fabrication imperfections." Microsystem Technologies: 1-10, 2014.

[32] A. H. Nayfeh and D. T. Mook, Nonlinear OscillationsWiley, New York: Wiley, 1979, pp. 195-203.

A least the following is claimed:

1. A method of multi-frequency excitation of a microelectromechanical (MEMS) or nanoelectromechanical (NEMS) device, comprising:
    applying a first source of excitation to the device, the first source of excitation having a relatively small fixed frequency;
    applying a second source of excitation to the device; and
    sweeping a frequency of the second source of excitation around a natural frequency of the device to induce at least one combination resonance in the device based on a combination of the frequency of the second source of excitation and the relatively small fixed frequency of the first source of excitation.

2. The method of claim 1, wherein:
    the at least one combination resonance comprises combination resonances of additive and subtractive types in the device; and
    the relatively small fixed frequency provides spacing between peaks of the natural frequency of the device and the combination resonances of additive and subtractive types in the device.

3. The method of claim 2, further comprising selecting a voltage amplitude of the first source of excitation for the device.

4. The method of claim 3, further comprising selecting a voltage amplitude of the second source of excitation for the device.

5. The method of claim 1, further comprising selecting a voltage amplitude of the first source of excitation for the device.

6. The method of claim 5, further comprising adjusting the voltage amplitude of the first source of excitation to adjust an amplitude of the least one combination resonance in the device.

7. The method of claim 1, further comprising selecting a voltage amplitude of the second source of excitation for the device.

8. The method of claim 7, further comprising adjusting the voltage amplitude of the second source of excitation to adjust an amplitude of a natural frequency resonance of the device.

9. The method of claim 1, further comprising increasing an operating bandwidth of the device by setting the fixed frequency of the first source of excitation to a relatively low frequency.

10. The method of claim 1, further comprising increasing an operating bandwidth of the device by applying one or more other sources of excitation to the device.

11. A system for multi-frequency excitation, comprising:
    a microelectromechanical (MEMS) or nanoelectromechanical (NEMS) device;
    a first source of excitation, the first source of excitation having a fixed frequency applied to the device; and
    a second source of excitation, a frequency of the second source of excitation applied to the device and being swept to induce at least one combination resonance in the device based on a combination of the frequency of the second source of excitation and the fixed frequency of the first source of excitation.

12. The system of claim 11, wherein the first source of excitation has a relatively small fixed frequency.

13. The system of claim 12, wherein:
    the at least one combination resonance comprises combination resonances of additive and subtractive types in the device; and
    the relatively small fixed frequency provides spacing between peaks of the natural frequency of the device and the combination resonances of additive and subtractive types in the device.

14. The system of claim 12, wherein the second source of excitation is swept around a natural frequency of the device to induce the at least one combination resonance in the device.

15. The system of claim 14, wherein:
    the at least one combination resonance comprises combination resonances of additive and subtractive types in the device; and
    the relatively small fixed frequency provides spacing between peaks of the natural frequency of the device and the combination resonances of additive and subtractive types in the device.

16. The system of claim 11, wherein the second source of excitation is swept around a natural frequency of the device to induce the at least one combination resonance in the device.

17. The system of claim 11, wherein a voltage amplitude of the first source of excitation is adjusted to adjust an amplitude of the least one combination resonance in the device.

18. The system of claim 11, wherein a voltage amplitude of the second source of excitation is adjusted to adjust an amplitude of a natural frequency resonance of the device.

19. The system of claim 11, further comprising one or more other sources of excitation that increases an operating bandwidth of the device.

20. A method of multi-frequency excitation of a device, comprising:
    determining a natural frequency of the device;
    selecting a first voltage amplitude of a first source of excitation for the device;
    selecting a fixed frequency of the first source of excitation based on the natural frequency;
    selecting a second voltage amplitude of a second source of excitation for the device;
    applying the first source of excitation to the device;
    applying the second source of excitation to the device; and
    sweeping a frequency of the second source of excitation.

* * * * *